(12) United States Patent
Mizuta

(10) Patent No.: US 12,652,994 B2
(45) Date of Patent: Jun. 9, 2026

(54) BONDING APPARATUS, BONDING METHOD, AND METHOD OF MANUFACTURING SEMICONDUCTOR DEVICE

(71) Applicant: Kioxia Corporation, Tokyo (JP)

(72) Inventor: Yoshio Mizuta, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 330 days.

(21) Appl. No.: 18/166,408

(22) Filed: Feb. 8, 2023

(65) Prior Publication Data

US 2023/0411197 A1     Dec. 21, 2023

(30) Foreign Application Priority Data

Jun. 15, 2022    (JP) ................................. 2022-096807

(51) Int. Cl.
| | |
|---|---|
| *H01L 21/68* | (2006.01) |
| *G01B 11/27* | (2006.01) |
| *H10D 84/03* | (2025.01) |
| *H10D 88/00* | (2025.01) |
| *H10P 72/00* | (2026.01) |
| *H10P 72/50* | (2026.01) |
| *H10P 74/00* | (2026.01) |
| *H10W 46/00* | (2026.01) |

(52) U.S. Cl.
CPC .............. *H10P 72/53* (2026.01); *G01B 11/27* (2013.01); *H10D 84/038* (2025.01); *H10D 88/01* (2025.01); *H10P 72/0428* (2026.01); *H10P 74/23* (2026.01); *H10W 46/00* (2026.01); *H10W 46/301* (2026.01)

(58) Field of Classification Search
CPC . H01L 21/681; H01L 21/67092; H01L 22/20; H01L 23/544; H01L 2223/54426; H01L 21/67259; G01B 11/27; H10D 84/038; H10D 88/01
See application file for complete search history.

(56) References Cited

U.S. PATENT DOCUMENTS

| | | | |
|---|---|---|---|
| 5,465,724 A | * | 11/1995 | Sliwa, Jr. ............. A61B 8/4461 |
| | | | 600/459 |
| 8,454,771 B2 | | 6/2013 | Horikoshi |
| 9,851,645 B2 | * | 12/2017 | Wagenleitner .......... H01L 22/26 |

(Continued)

FOREIGN PATENT DOCUMENTS

| | | | | |
|---|---|---|---|---|
| JP | 2005294742 A | * | 10/2005 | ......... G03F 7/70641 |
| JP | 2014030025 A | | 2/2014 | |

(Continued)

*Primary Examiner* — Mohamed K Amara
(74) *Attorney, Agent, or Firm* — Holtz, Holtz & Volek PC

(57) ABSTRACT

According to one embodiment, a bonding apparatus includes first and second stages, first and second measuring devices, a stress generator, and a controller. The controller generates a focus map for each deformation amount of the first stage based on a deformation amount of the first stage deformed by the stress generator and the shape of the first substrate held by the deformed first stage. In the alignment processing of the first substrate, when causing the first measuring device to measure an alignment mark arranged on the first substrate held by the first stage, the controller uses a focus setting based on the focus map corresponding to the deformation amount applied to the first stage.

17 Claims, 21 Drawing Sheets

(56) References Cited

U.S. PATENT DOCUMENTS

| | | | | |
|---|---|---|---|---|
| 10,204,812 | B2 | 2/2019 | Dragoi | |
| 10,438,920 | B2* | 10/2019 | Otsuka | H01L 24/75 |
| 10,886,156 | B2* | 1/2021 | Wimplinger | H01L 21/683 |
| 10,943,807 | B2* | 3/2021 | Wagenleitner | H01L 23/544 |
| 11,417,543 | B2 | 8/2022 | Otsuka et al. | |
| 12,106,993 | B2* | 10/2024 | Krol | G01B 11/272 |
| 12,199,062 | B2* | 1/2025 | Zinner | H01L 21/67092 |
| 2006/0141744 | A1* | 6/2006 | Best | H01L 25/50 |
| | | | | 257/E21.705 |
| 2006/0169677 | A1* | 8/2006 | Deshi | B23K 26/382 |
| | | | | 219/121.7 |
| 2008/0245843 | A1* | 10/2008 | Suga | H01L 24/75 |
| | | | | 228/116 |
| 2010/0231928 | A1* | 9/2010 | Tanaka | H01L 21/67092 |
| | | | | 355/72 |
| 2016/0336212 | A1* | 11/2016 | Johnson | H01L 21/68721 |
| 2017/0278803 | A1* | 9/2017 | Sugaya | H01L 24/75 |
| 2018/0019140 | A1* | 1/2018 | Inamasu | H01L 21/67201 |
| 2018/0144967 | A1* | 5/2018 | Dragoi | H01L 21/67092 |
| 2018/0180722 | A1* | 6/2018 | Pei | G01S 17/89 |
| 2021/0003930 | A1* | 1/2021 | Yamaguchi | G03F 9/7088 |
| 2021/0050243 | A1* | 2/2021 | Otsuka | H01L 21/67259 |
| 2021/0088588 | A1* | 3/2021 | Endo | G01R 31/2887 |
| 2021/0242044 | A1* | 8/2021 | Mitsuishi | H01L 21/6833 |
| 2023/0067346 | A1* | 3/2023 | Chen | H01L 24/74 |
| 2023/0091517 | A1* | 3/2023 | Mizuta | H01L 21/6838 |
| | | | | 156/60 |
| 2024/0006207 | A1* | 1/2024 | Nakamitsu | H01L 21/67259 |
| 2025/0004388 | A1* | 1/2025 | Fujishima | G03F 7/70666 |
| 2026/0005059 | A1* | 1/2026 | Sreenivasan | H10P 72/722 |

FOREIGN PATENT DOCUMENTS

| | | | | |
|---|---|---|---|---|
| JP | 5531508 | B2 | 5/2014 | |
| JP | 5600952 | B2 | 8/2014 | |
| JP | 5943030 | B2 | 6/2016 | |
| JP | 2020013813 | A | 1/2020 | |
| JP | 6805180 | B2 | 12/2020 | |
| JP | 7566590 | B2 * | 10/2024 | G03F 9/7088 |

* cited by examiner

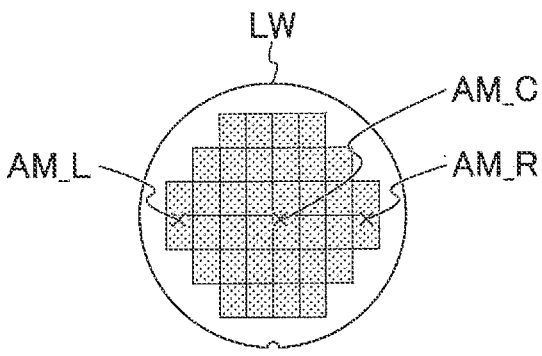
FIG. 2
(A) Arrangement of alignment mark AM
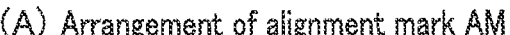
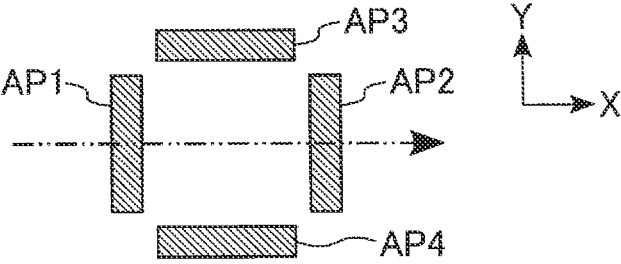
(B) Signal waveform of alignment mark AM
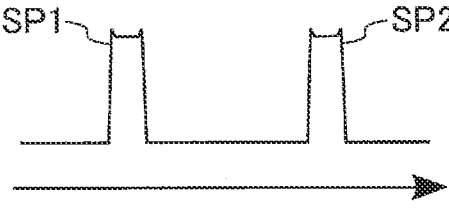
FIG. 3

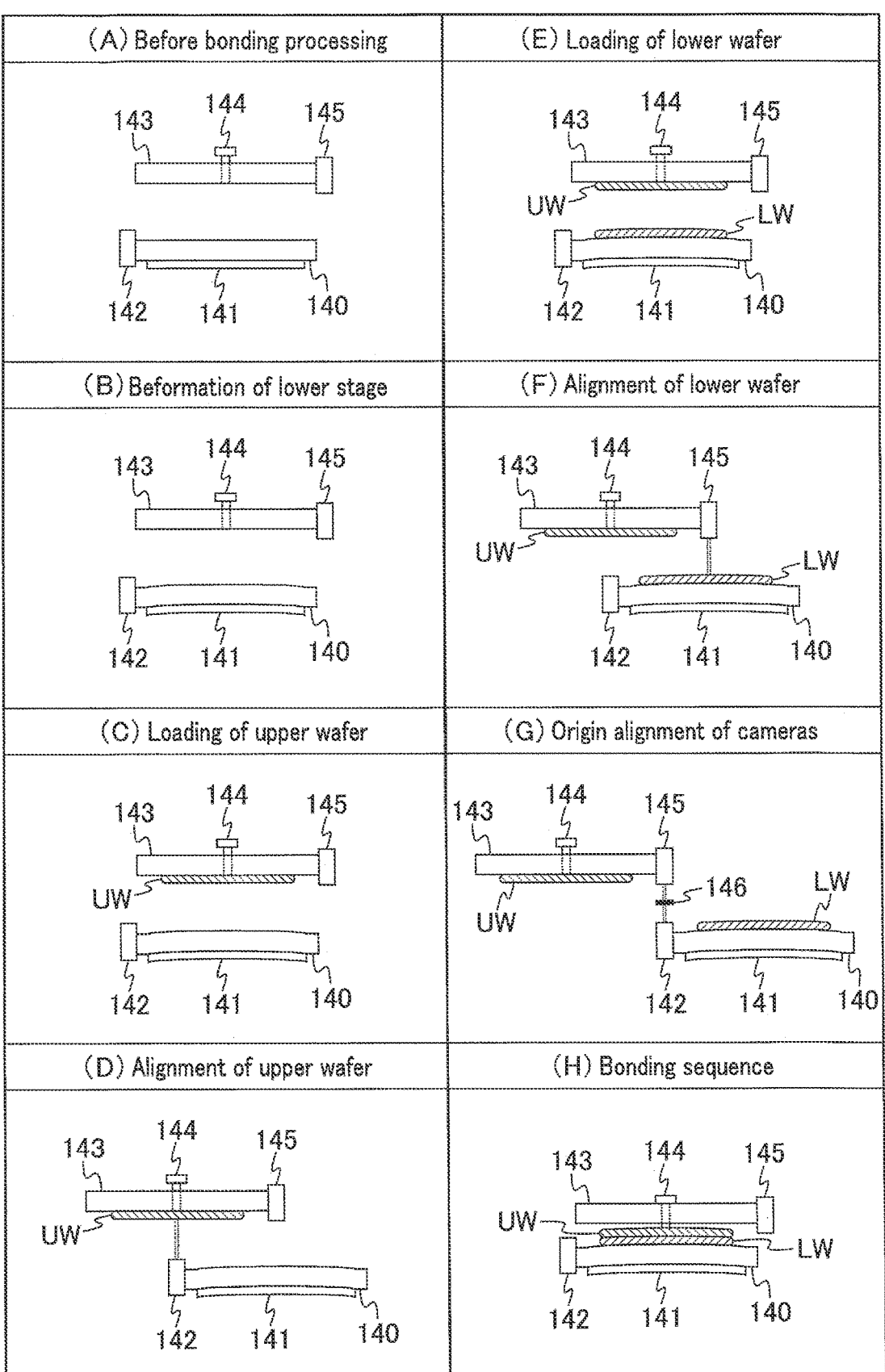
F I G. 5

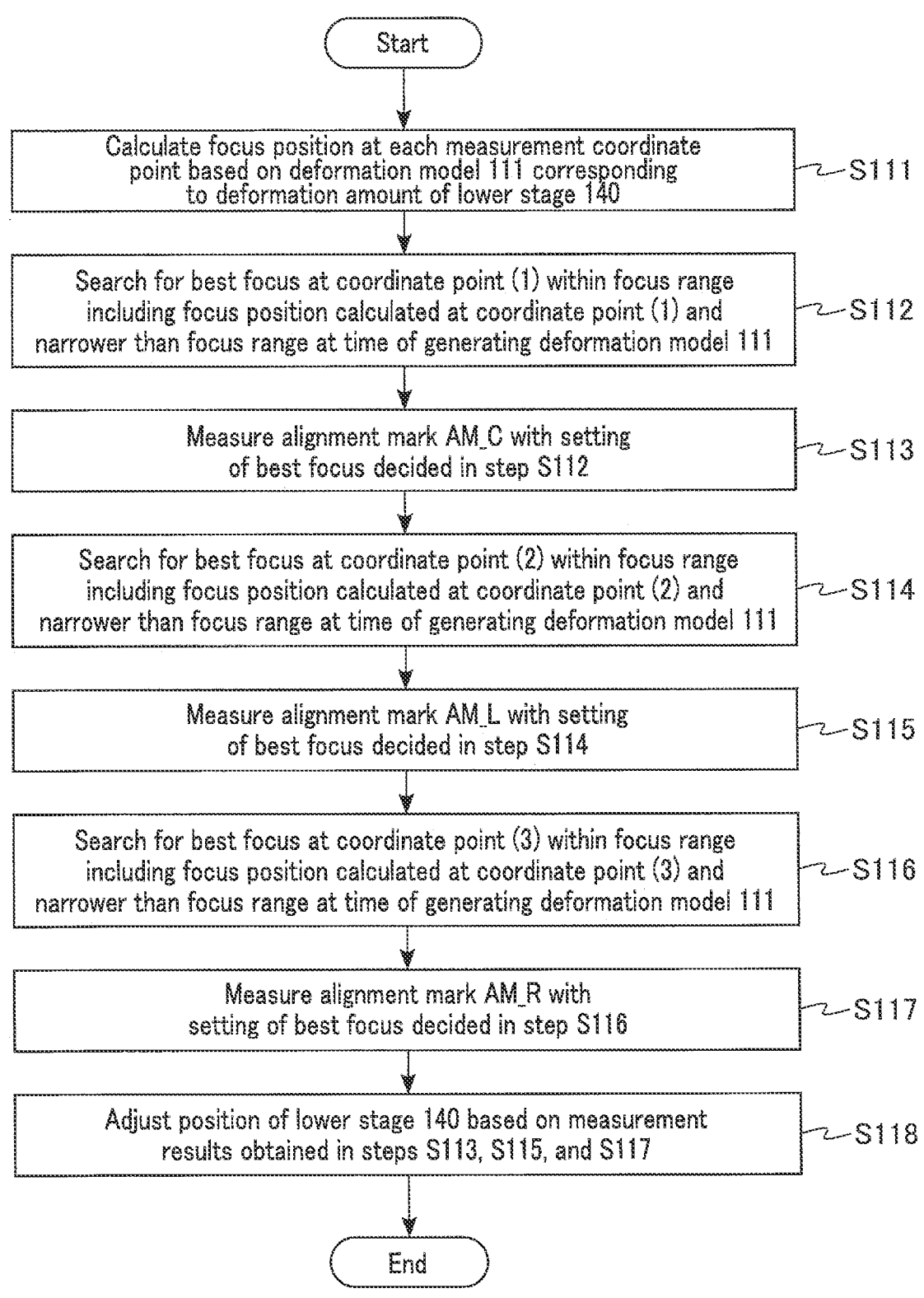

Start

Calculate focus position at each measurement coordinate point based on deformation model 111 corresponding to deformation amount of lower stage 140 — S111

Search for best focus at coordinate point (1) within focus range including focus position calculated at coordinate point (1) and narrower than focus range at time of generating deformation model 111 — S112

Measure alignment mark AM_C with setting of best focus decided in step S112 — S113

Search for best focus at coordinate point (2) within focus range including focus position calculated at coordinate point (2) and narrower than focus range at time of generating deformation model 111 — S114

Measure alignment mark AM_L with setting of best focus decided in step S114 — S115

Search for best focus at coordinate point (3) within focus range including focus position calculated at coordinate point (3) and narrower than focus range at time of generating deformation model 111 — S116

Measure alignment mark AM_R with setting of best focus decided in step S116 — S117

Adjust position of lower stage 140 based on measurement results obtained in steps S113, S115, and S117 — S118

End

F I G. 8

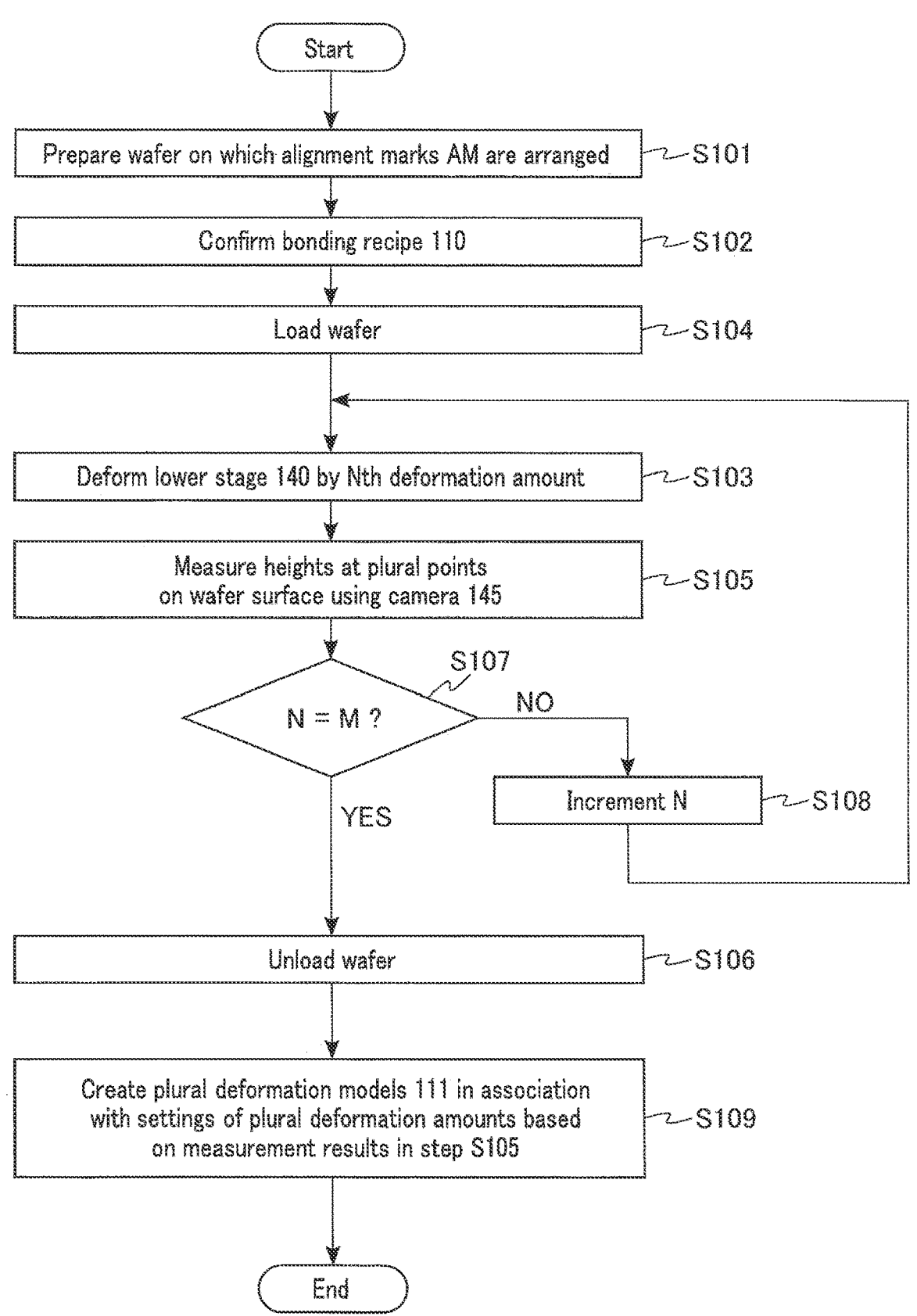
F I G. 10

| Deformation of lower stage 140 | Measurement image | Signal waveform of one pattern AP | | |
| --- | --- | --- | --- | --- |
| | | (2) AM_L | (1) AM_C | (3) AM_R |
| Absent | Measurement coordinate point (2) (1) (3) 145 LW 140 | BF DF | BF DF | BF DF |
| Present | Measurement coordinate point (2) (1) (3) 145 LW 140 | DFm DFp BF | BF DF | DFp DFm BF |

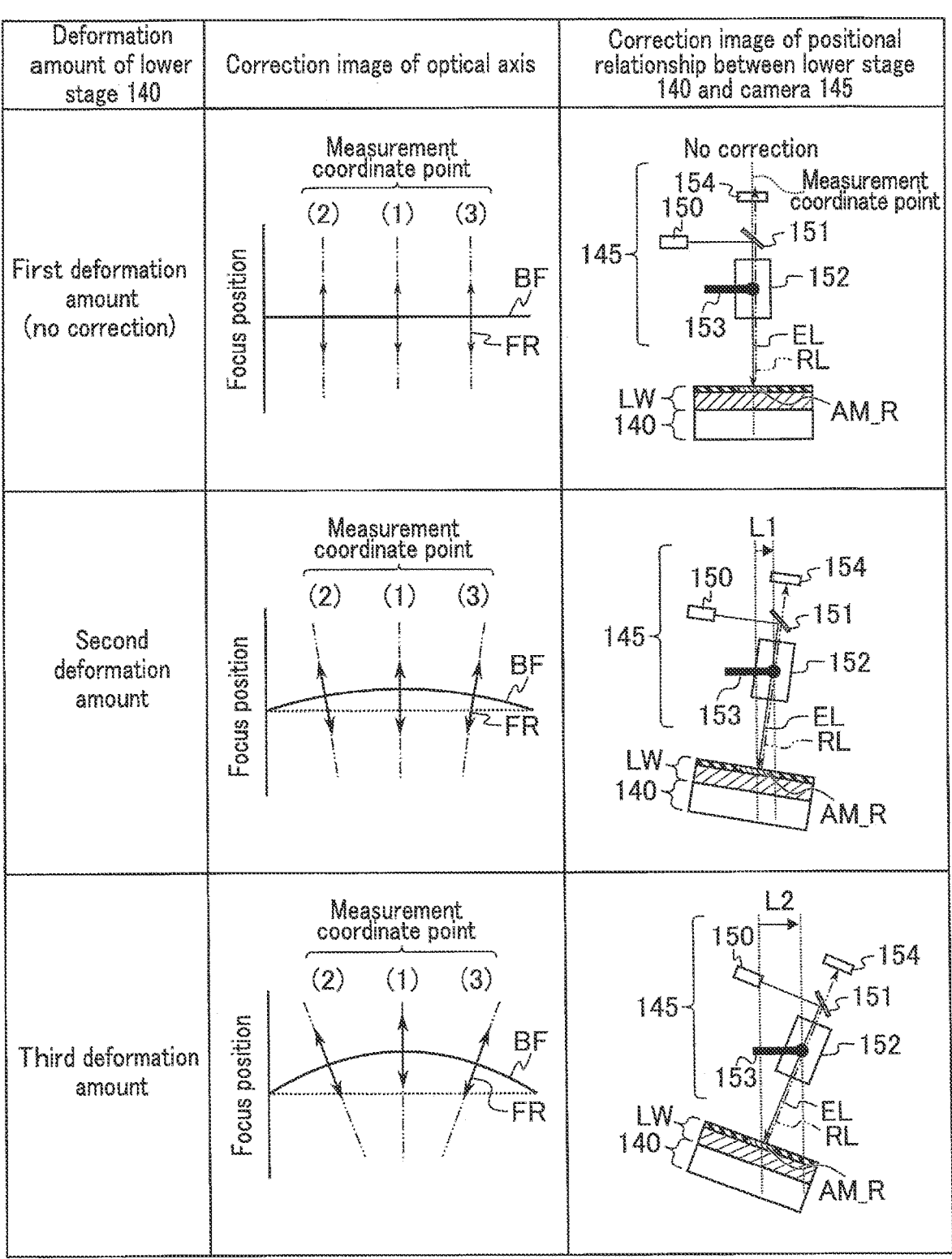
F I G. 14

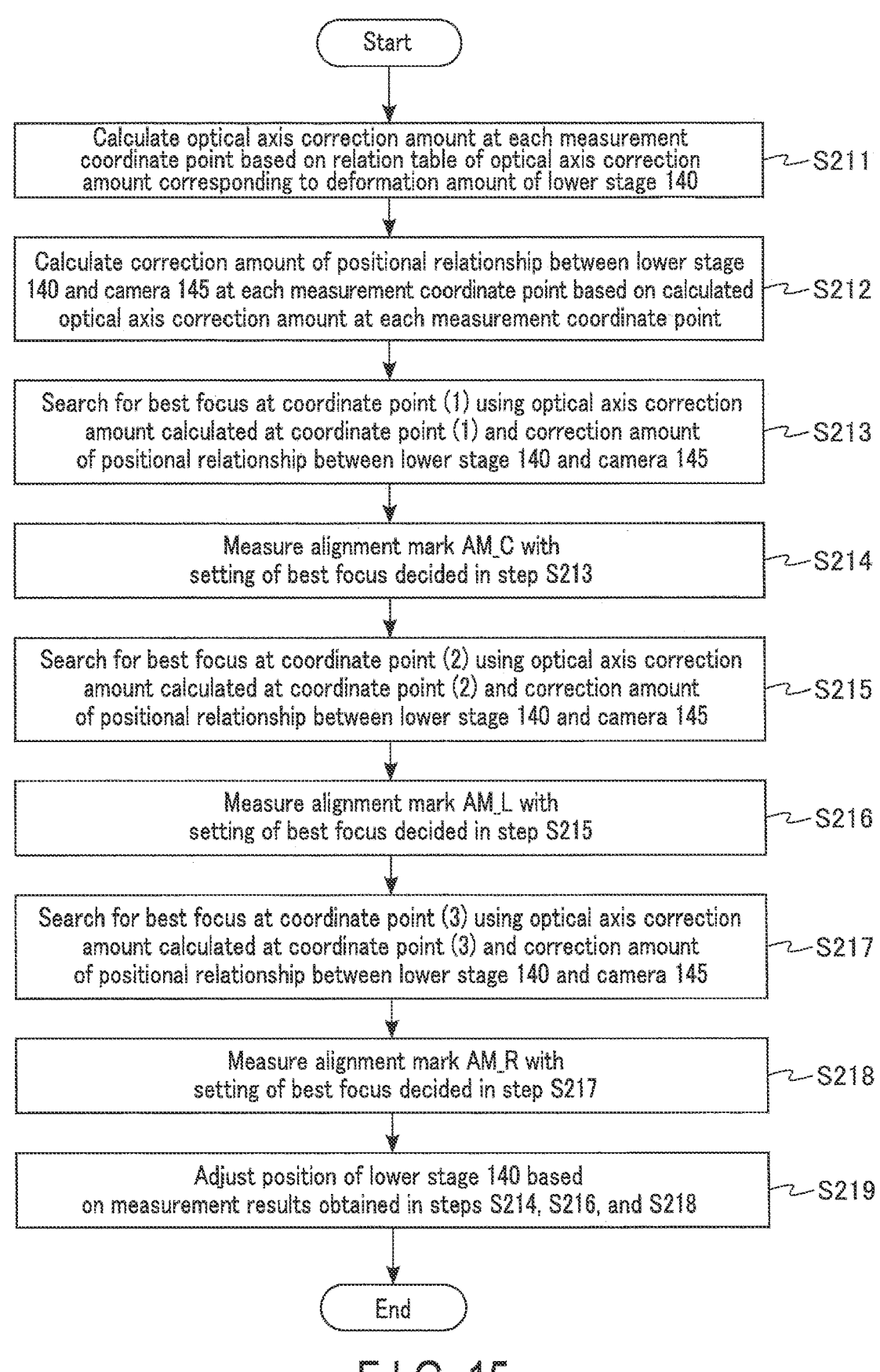

Start

Calculate optical axis correction amount at each measurement coordinate point based on relation table of optical axis correction amount corresponding to deformation amount of lower stage 140 ～S211

Calculate correction amount of positional relationship between lower stage 140 and camera 145 at each measurement coordinate point based on calculated optical axis correction amount at each measurement coordinate point ～S212

Search for best focus at coordinate point (1) using optical axis correction amount calculated at coordinate point (1) and correction amount of positional relationship between lower stage 140 and camera 145 ～S213

Measure alignment mark AM_C with setting of best focus decided in step S213 ～S214

Search for best focus at coordinate point (2) using optical axis correction amount calculated at coordinate point (2) and correction amount of positional relationship between lower stage 140 and camera 145 ～S215

Measure alignment mark AM_L with setting of best focus decided in step S215 ～S216

Search for best focus at coordinate point (3) using optical axis correction amount calculated at coordinate point (3) and correction amount of positional relationship between lower stage 140 and camera 145 ～S217

Measure alignment mark AM_R with setting of best focus decided in step S217 ～S218

Adjust position of lower stage 140 based on measurement results obtained in steps S214, S216, and S218 ～S219

End

F I G. 15

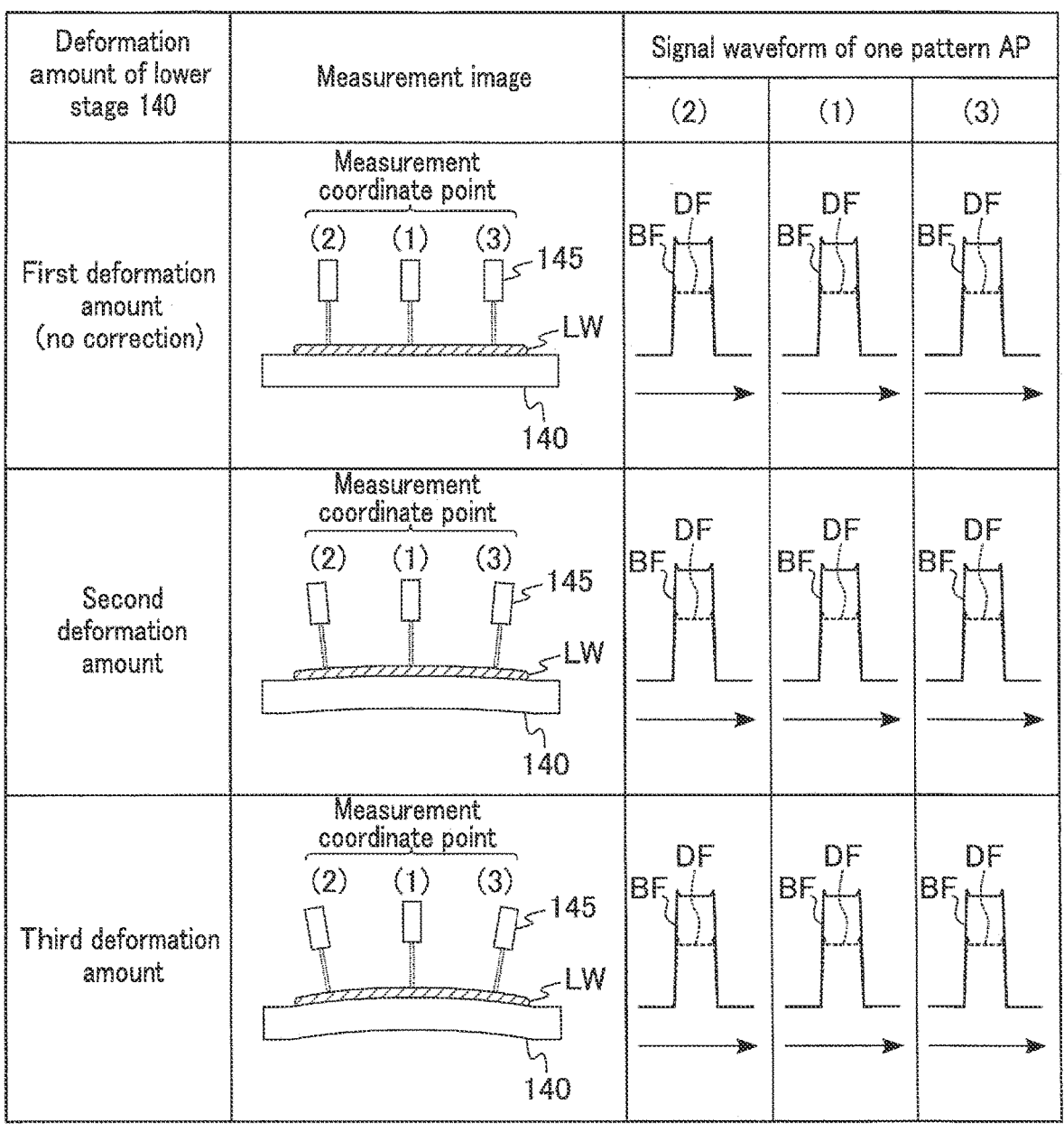
F I G. 16

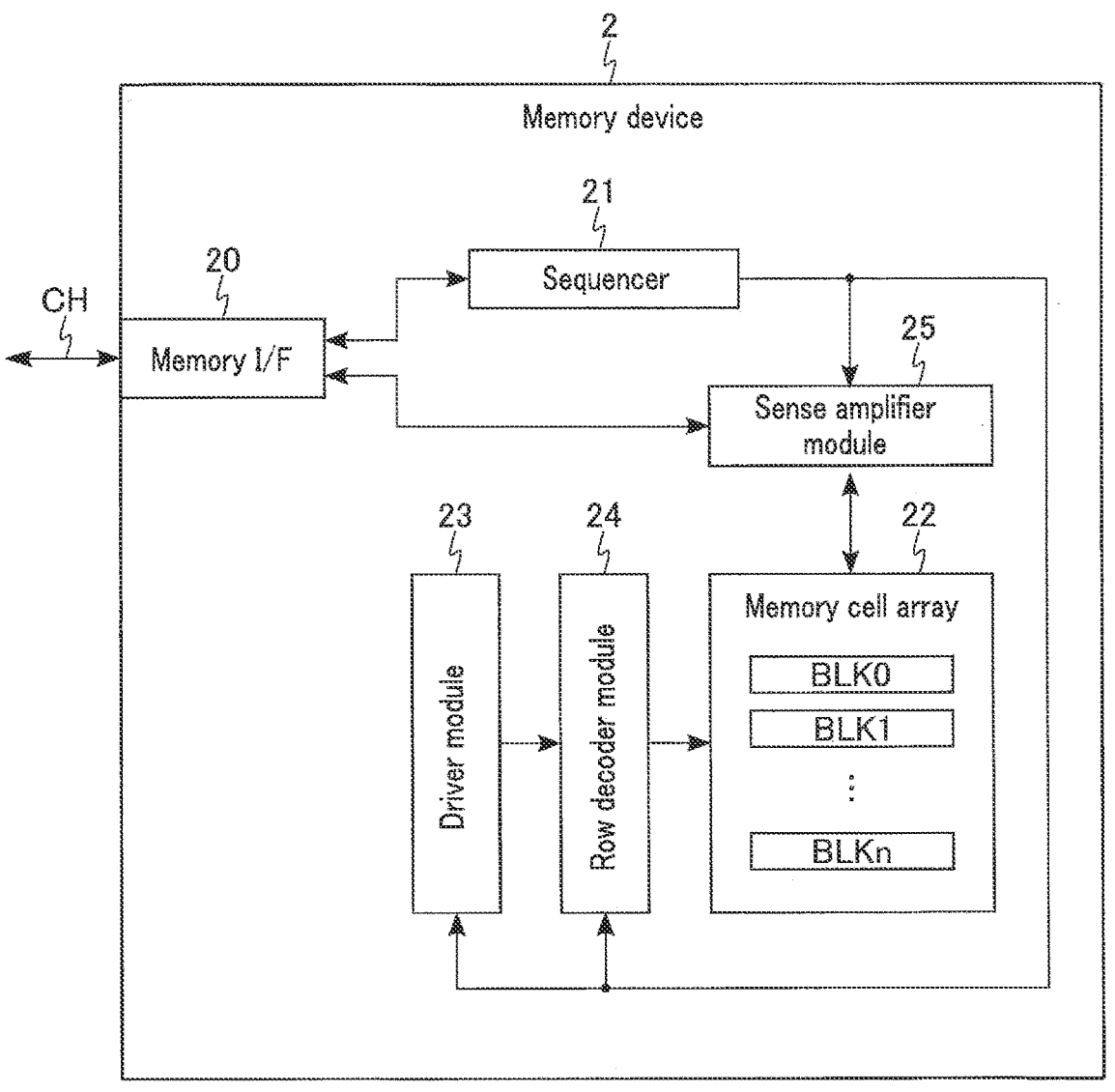
F I G. 17

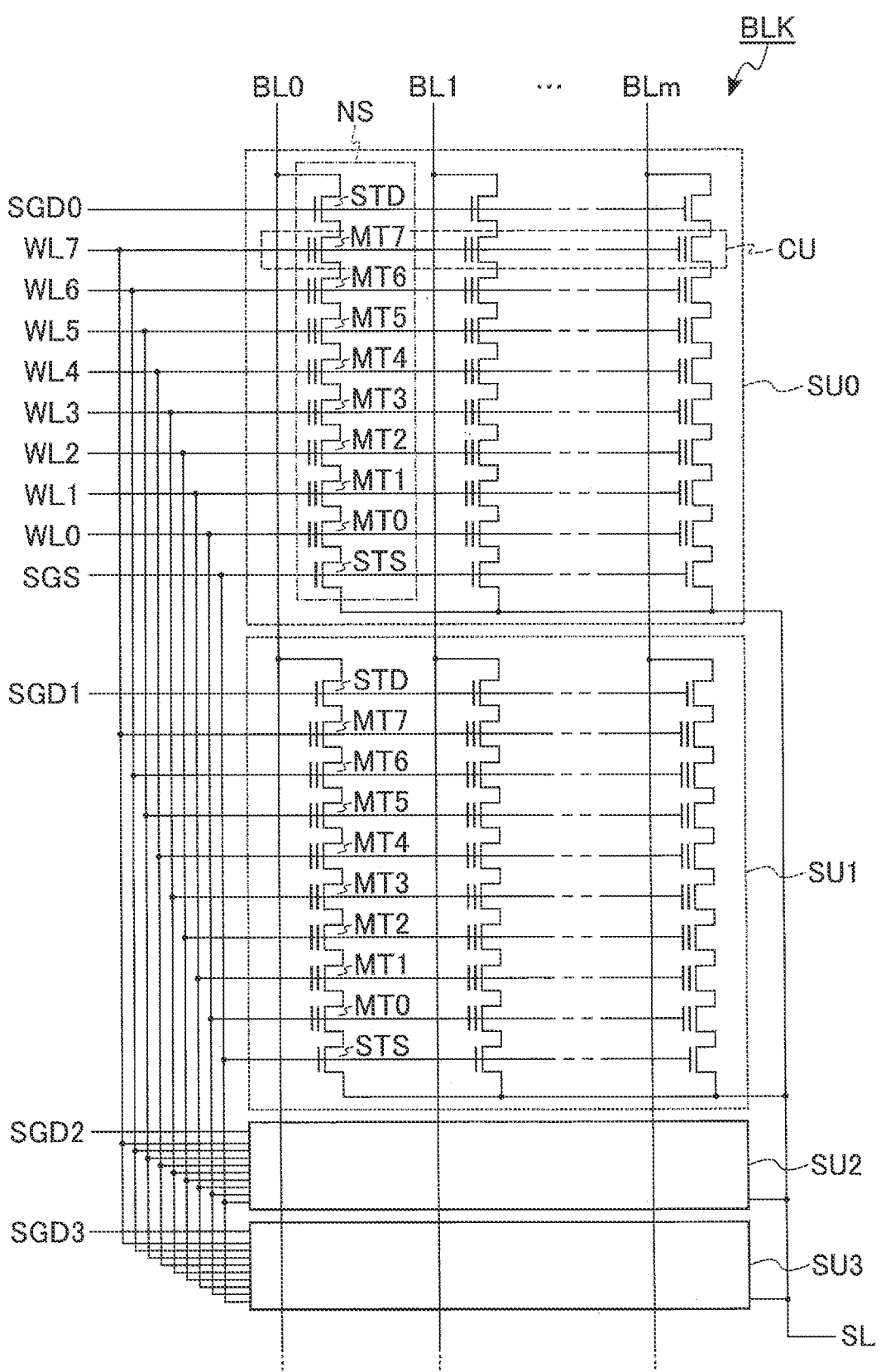
F I G. 18

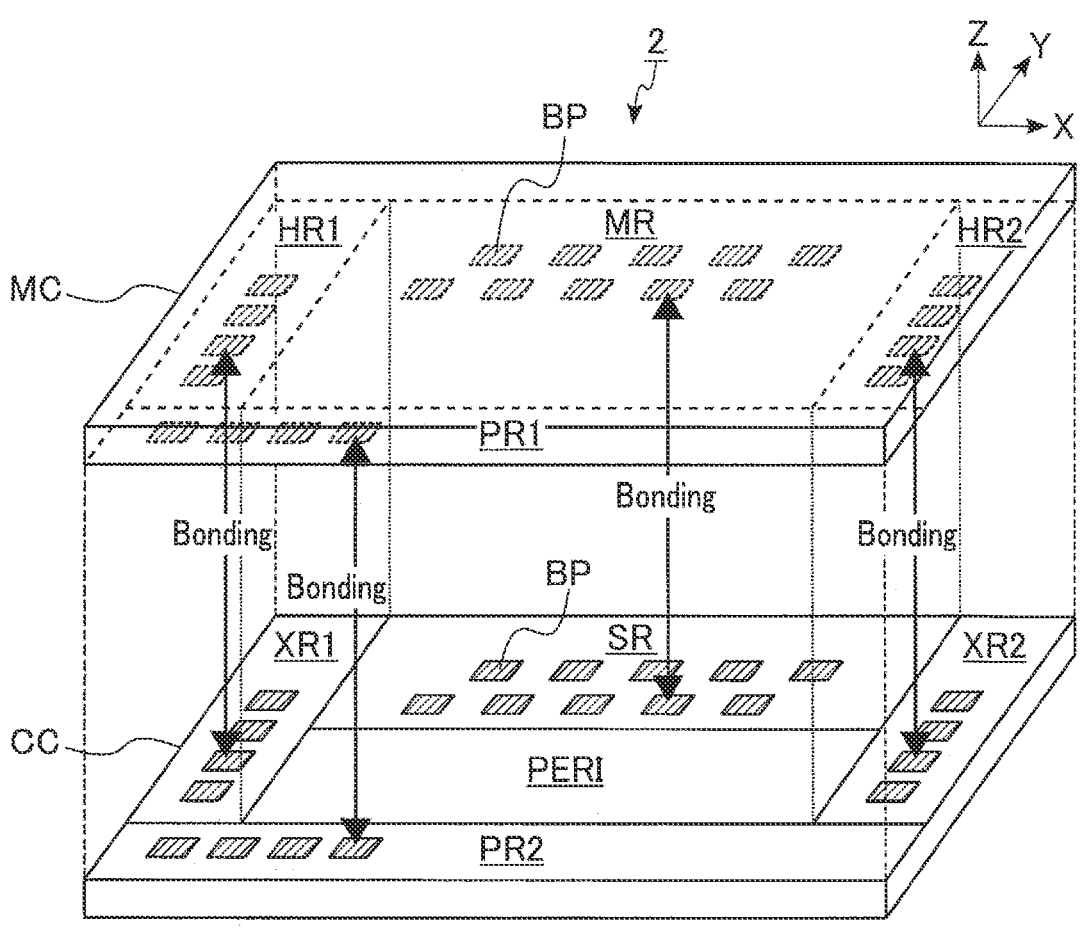
F I G. 19

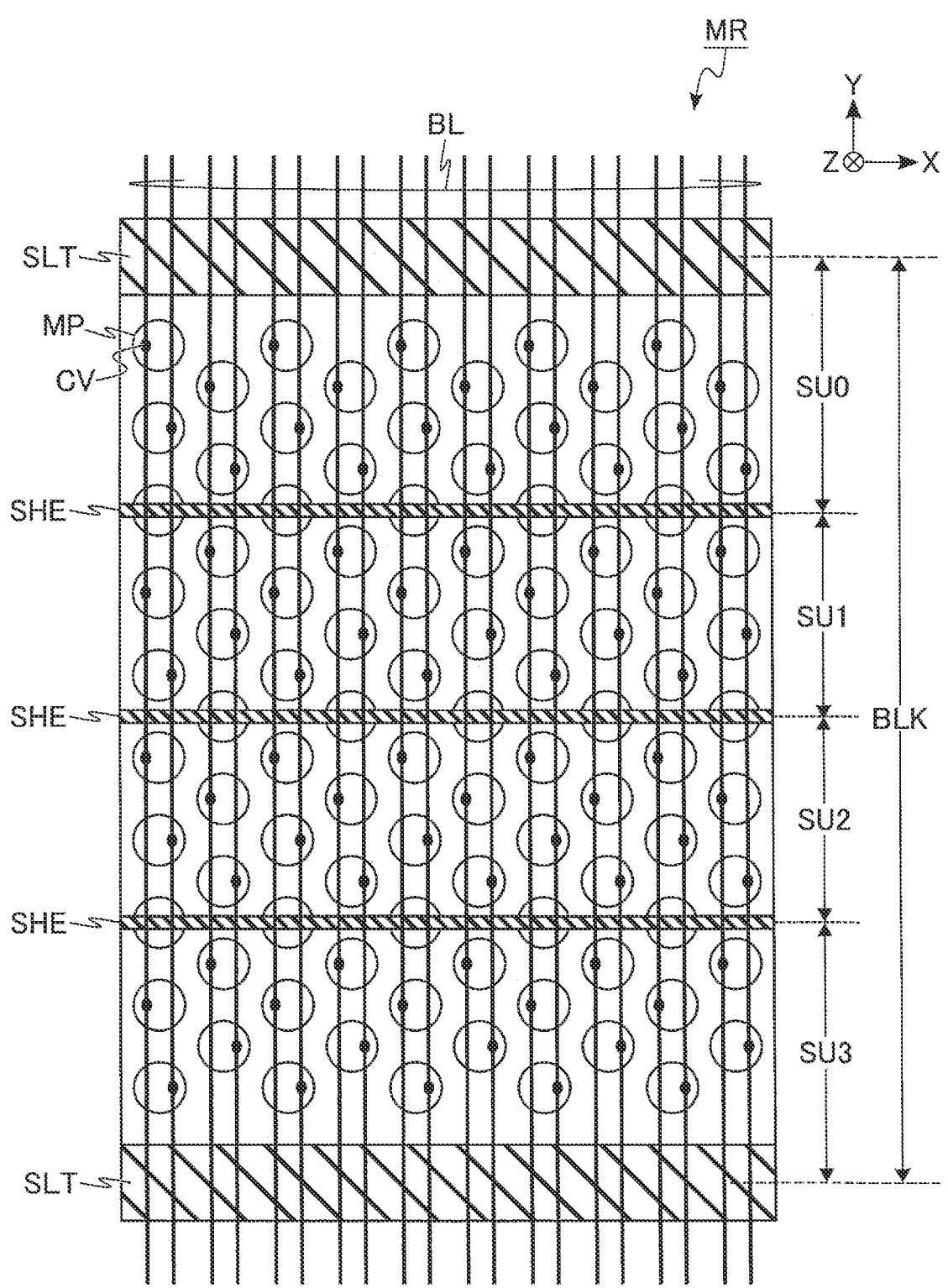
F I G. 20

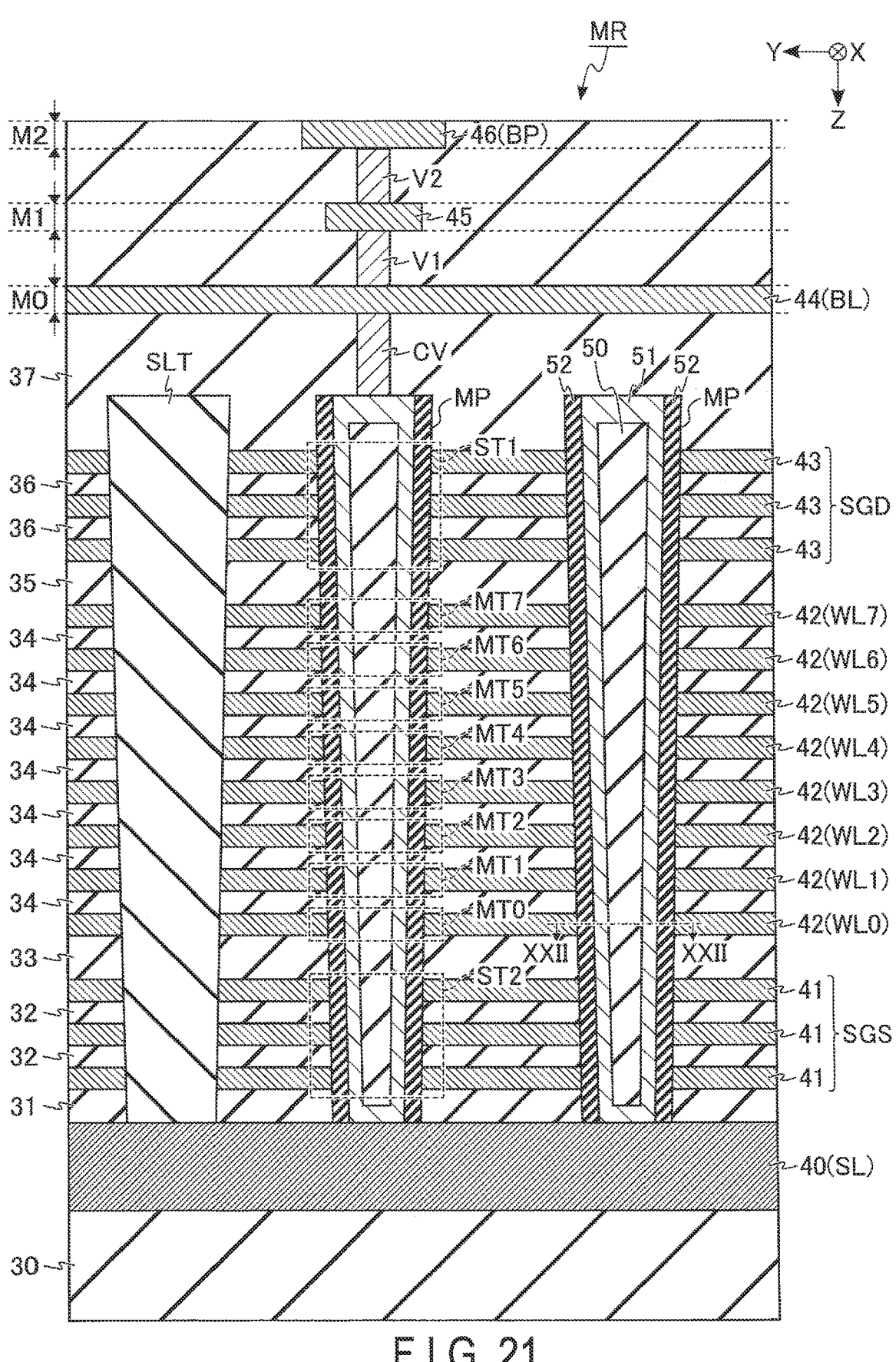
F I G. 21

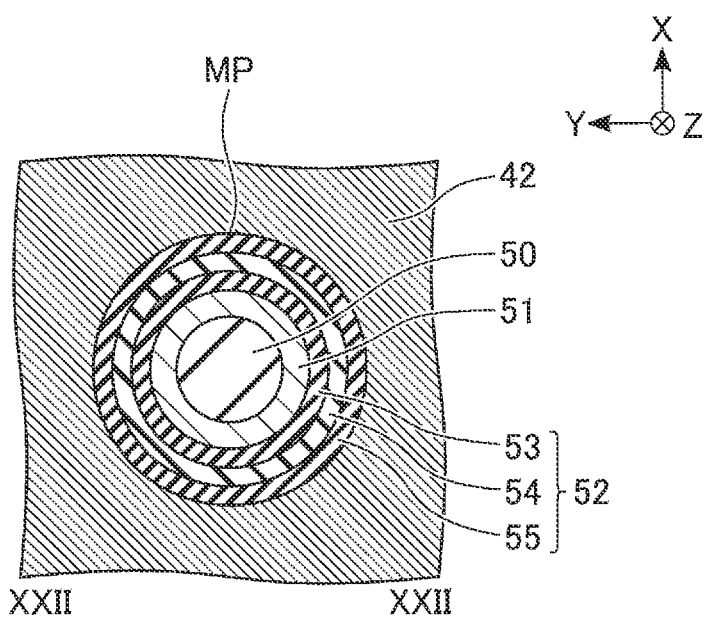
F I G. 22

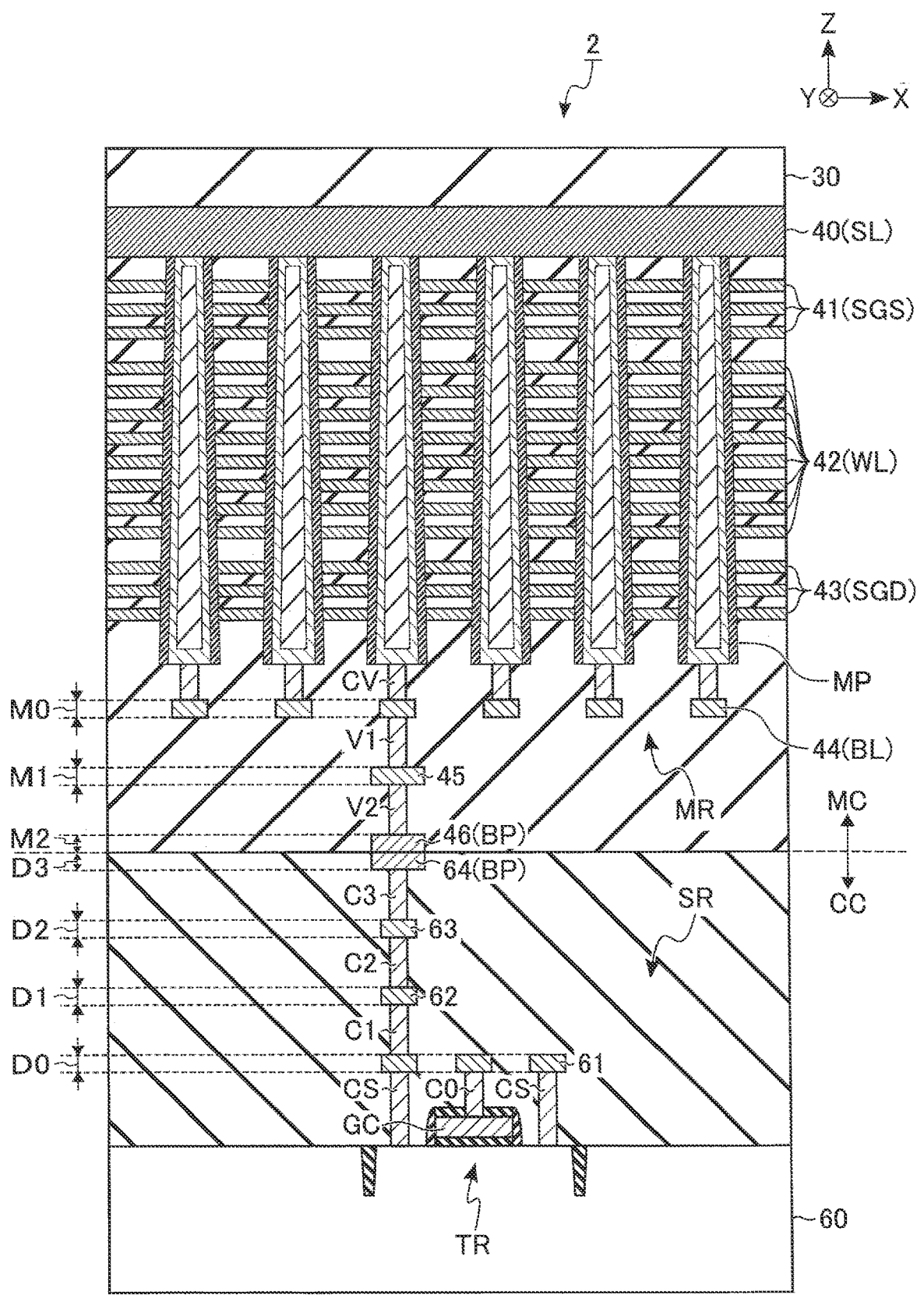
F I G. 23

BONDING APPARATUS, BONDING METHOD, AND METHOD OF MANUFACTURING SEMICONDUCTOR DEVICE

CROSS-REFERENCE TO RELATED APPLICATION(S)

This application is based upon and claims the benefit of priority from prior Japanese Patent Application No. 2022-096807, filed Jun. 15, 2022, the entire contents of which are incorporated herein by reference.

FIELD

Embodiments described herein relate generally to a bonding apparatus, a bonding method, and a method of manufacturing a semiconductor device.

BACKGROUND

A three-dimensional stacking technique of three-dimensionally stacking semiconductor circuit substrates is known.

BRIEF DESCRIPTION OF THE DRAWINGS

FIG. 2 is a schematic view showing an example of the arrangement of alignment marks on a lower wafer used in a semiconductor device manufacturing process.

FIG. 3 is a schematic view showing examples of the shape and signal waveform of an alignment mark arranged on a wafer.

FIG. 5 is a schematic view showing an example of the procedure of boding processing by the bonding apparatus according to the first embodiment.

FIG. 8 is a flowchart illustrating details of an example of alignment processing of a lower wafer LW included in the bonding processing by the bonding apparatus according to the first embodiment.

FIG. 10 is a flowchart illustrating a modification of the method of creating the deformation model to be used by the bonding apparatus according to the first embodiment.

FIG. 14 is a schematic view showing a practical example of a method of measuring an alignment mark in alignment processing of a lower wafer included in bonding processing by the bonding apparatus according to the second embodiment.

FIG. 15 is a flowchart illustrating an example of the bonding processing by the bonding apparatus according to the second embodiment.

FIG. 16 is a schematic view showing examples of a measurement image of an alignment mark on the lower wafer and the signal waveform of one pattern in the bonding apparatus according to the second embodiment.

FIG. 17 is a block diagram showing an example of the configuration of a memory device according to the third embodiment.

FIG. 18 is a circuit diagram showing an example of the circuit configuration of a memory cell array provided in the memory device according to the third embodiment.

FIG. 19 is a perspective view showing an example of the structure of the memory device according to the third embodiment.

FIG. 20 is a plan view showing an example of the planar layout of the memory cell array provided in the memory device according to the third embodiment.

FIG. 21 is a sectional view showing an example of the cross-sectional structure of the memory cell array provided in the memory device according to the third embodiment.

FIG. 22 is a sectional view taken along a line XXII-XXII in FIG. 21, and showing an example of the cross-sectional structure of a memory pillar provided in the memory device according to the third embodiment.

FIG. 23 is a sectional view showing an example of the cross-sectional structure of the memory device according to the third embodiment.

DETAILED DESCRIPTION

Figure 1:
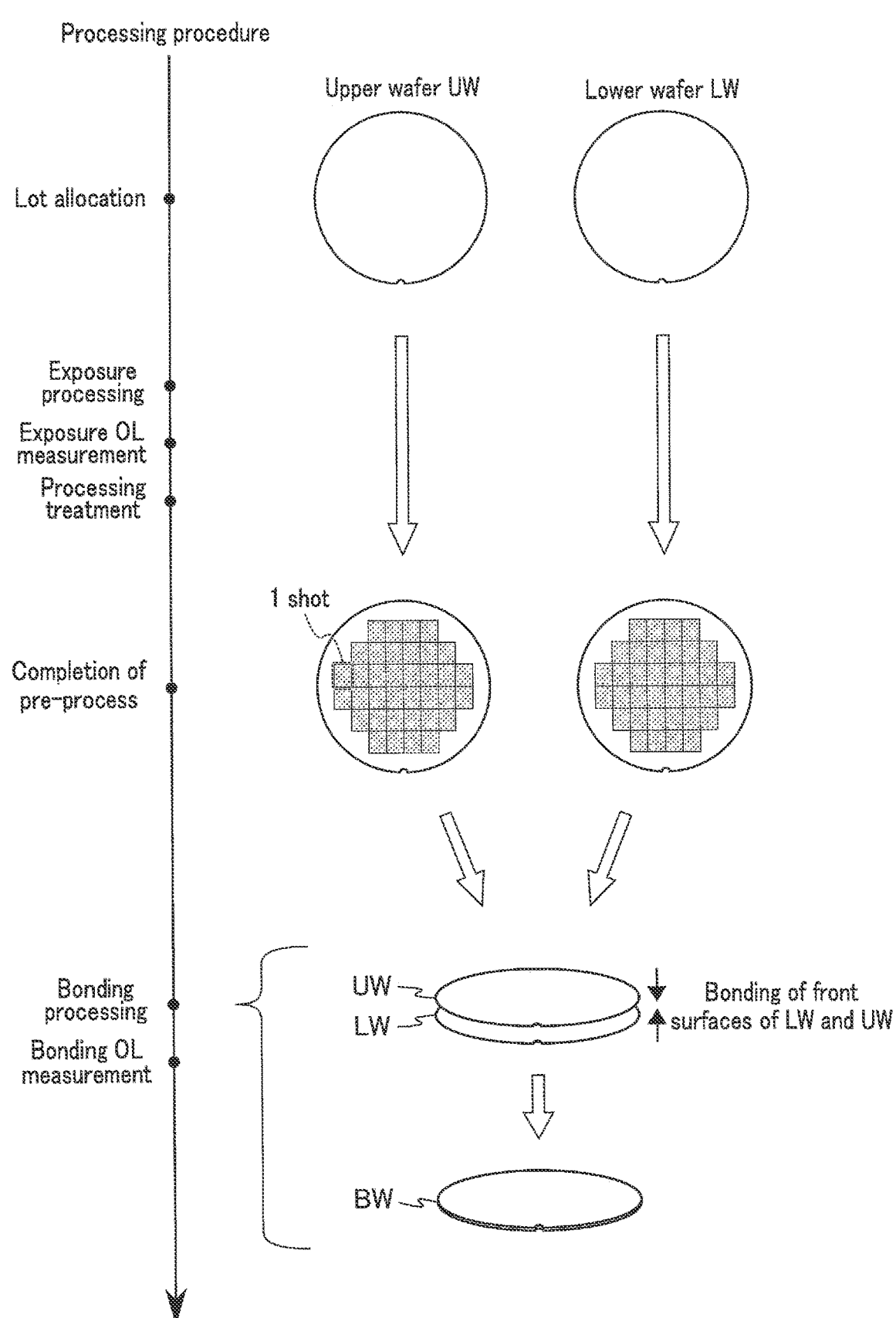
FIG. 1 is a schematic view showing an overview of a method of manufacturing a semiconductor device.

In general, according to one embodiment, a bonding apparatus includes a first stage, a second stage, a first measuring device, a second measuring device, a stress generator, and a controller. The first stage can hold a first substrate. The second stage is arranged to face the first stage and can hold a second substrate. The first measuring device can measure an alignment mark arranged on the first substrate held by the first stage. The second measuring device can measure an alignment mark arranged on the second substrate held by the second stage. The stress generator can apply stress to the first stage. The controller executes bonding processing. The bonding processing includes alignment processing of each of the first substrate and the second substrate, and bonds the first substrate and the second substrate. The controller generates a focus map for each deformation amount of the first stage based on the deformation amount of the first stage deformed by the stress generator and the shape of the first substrate held by the deformed first stage. In the alignment processing of the first substrate, when causing the first measuring device to measure the alignment mark arranged on the first substrate held by the first stage, the controller uses a focus setting based on the focus map corresponding to the deformation amount applied to the first stage.

Embodiments will be described below with reference to the accompanying drawings. Each embodiment exemplifies an apparatus and a method for embodying the technical concepts of the invention. The drawings are schematic or conceptual. Dimensions, ratios, and the like of each drawing are not necessarily the same as the actual dimensions, ratios, and the like. Illustrations of configurations are appropriately omitted. The hatching added to the drawings is not necessarily related to the materials or characteristics of constituent elements. In the present specification, constituent elements having substantially the same functions and configurations have the same reference signs assigned thereto. Numerals and the like appended to the reference signs are referred to using the same reference signs and are used to distinguish between similar elements.

The semiconductor device of the present specification is formed by bonding two semiconductor circuit substrates each having a semiconductor circuit formed thereon and separating the bonded semiconductor circuit substrates into chips. A semiconductor circuit substrate will be referred to as a "wafer" hereinafter. An apparatus that executes exposure processing will be referred to as an "exposure apparatus" hereinafter. Processing of bonding two wafers will be referred to as "bonding processing" hereinafter. An apparatus that executes the bonding processing will be referred to as a "bonding apparatus" hereinafter. The wafer disposed on the upper side during the bonding processing will be referred to as an "upper wafer UW" hereinafter. The wafer disposed on the lower side during the bonding processing will be referred to as a "lower wafer LW" hereinafter. A pair of two bonded wafers, that is, the upper wafer UW and the lower wafer LW will be referred to as a "bonded wafer BW" hereinafter. In the present specification, the "wafer front surface" corresponds to the surface of the wafer on the upper side, and corresponds to a surface on the side where a semiconductor circuit is formed by a pre-process (to be described later). The "wafer back surface" corresponds to a surface on the opposite side of the wafer front surface. The X direction and the Y direction are directions that intersect each other, and that are parallel to the wafer front surface (horizontal direction). The Z direction is a direction that intersects each of the X direction and the Y direction, and that is perpendicular to the wafer front surface. "Up and down" in the present specification is defined based on a direction along the Z direction.

<0> Overview of Method of Manufacturing Semiconductor Device

FIG. 1 is a schematic view showing an overview of a method of manufacturing a semiconductor device. The approximate processing procedure of the method of manufacturing a semiconductor device of the present specification will be described below with reference to FIG. 1.

First, a wafer is allocated to a lot ("lot allocation"). A lot can include a plurality of wafers. Lots are categorized into, for example, a lot including the upper wafer UW and a lot including the lower wafer LW. Thereafter, a pre-process is performed on each of the lot including the upper wafer UW and the lot including the lower wafer LW, and a semiconductor circuit is formed on each of the upper wafer UW and the lower wafer LW. A pre-process includes a combination of "exposure processing", "exposure OL (overlay) measurement", and "processing treatment".

The exposure processing is, for example, processing of transferring a mask pattern to a wafer by irradiating the wafer, which is coated with a resist, with light having passed through the mask. A region to which the mask pattern is transferred through one exposure operation corresponds to "one shot". The "one shot" corresponds to a segregated region of exposure in the exposure processing. In the exposure processing, one-shot exposure is repeatedly executed with the exposure position shifted. That is, the exposure processing is executed using a step-and-repeat method. The layout of a plurality of shots on the upper wafer UW and the layout of a plurality of shots on the lower wafer LW are set to be identical.

In the exposure processing, the configuration and shape of each shot can be corrected based on measurement results of the alignment marks (to be described later), various correction values, and the like. This adjusts (aligns) the overlay position between the pattern formed by the exposure processing and the underlying pattern formed on the wafer. A correction value used in the alignment of the overlay position, that is, a control parameter for suppressing the overlay deviation will be referred to as an "alignment correction value" hereinafter. The alignment correction value can be represented by a combination of various components including offset (shift) components in the X direction and the Y direction, a magnification component, and an orthogonality component. In the present specification, the overlay deviation component of a magnification component generated on the wafer surface will be referred to as a "wafer magnification".

The exposure OL measurement is processing of measuring an overlay deviation amount between a pattern formed by the exposure processing and an underlying pattern in the exposure processing. The measurement result of the overlay deviation amount obtained by exposure OL measurement can be used to determine whether to rework the exposure processing, to calculate an alignment correction value to be applied to the subsequent lot, and the like. The processing treatment is processing of processing (for example, etching) the wafer by using a mask formed by the exposure processing. After the completion of the processing treatment, the used mask is removed and the next process is executed.

After the completion of the pre-process of each of the lot of the upper wafer UW and the lot of the lower wafer LW associated with each other, bonding processing is executed. In the bonding processing, the bonding apparatus arranges the front surface of the upper wafer UW and the front surface of the lower wafer LW to face each other. Then, in the bonding processing, the overlay position between the pattern formed on the front surface of the upper wafer UW and the pattern formed on the front surface of the lower wafer LW is adjusted. Thereafter, the bonding apparatus bonds the front surfaces of the upper wafer UW and the lower wafer LW to form the bonded wafer BW.

Bonding OL (overlay) measurement is executed on the bonded wafer BW formed by the bonding processing. The bonding OL measurement is processing of measuring an overlay deviation amount between the pattern formed on the front surface of the upper wafer UW and the pattern formed on the front surface of the lower wafer LW. The measurement result of the overlay deviation amount obtained by bonding OL measurement can be used to calculate an alignment correction value to be applied to the exposure processing of the subsequent lot, and the like. Each of the exposure apparatus and the bonding apparatus uses the measurement results of the alignment marks formed on the wafers to align the overlay position.

FIG. 2 is a schematic view showing an example of the configuration of alignment marks AM on the lower wafer LW used in the semiconductor device manufacturing process. Note that although not shown, the configuration of alignment marks AM on the upper wafer UW is, for example, the same as that on the lower wafer LW. As shown in FIG. 2, at the time of bonding processing, the bonding apparatus measures at least three alignment marks AM_C, AM_L, and AM_R arranged on each of the lower wafer LW and the upper wafer UW.

The alignment mark AM_C is arranged in the vicinity of the center of the wafer. The bonding apparatus can adjust the overlay of a shift component based on the measurement result of the alignment mark AM_C on each of the lower wafer LW and the upper wafer UW. The alignment marks AM_L and AM_R are arranged on one side and on the other side of the outer periphery of the wafer, respectively. The bonding apparatus can adjust the overlay of a rotation component (the same orthogonality component in the X direction and the Y direction) based on the measurement results of the alignment marks AM_L and AM_R on each of the lower wafer LW and the upper wafer UW. The bonding apparatus can have a function of deforming the stage holding the wafer. The bonding apparatus can correct the wafer magnification by causing the deformed stage to hold the wafer. For example, the bonding apparatus can use, as the wafer magnification correction value, the wafer magnification alignment correction value used in the exposure processing, a wafer magnification value that is calculated based on the exposure OL measurement result, or the like. In this way, the bonding apparatus can correct an overlay deviation between the bonding surfaces (front surfaces) of the lower wafer LW and the upper wafer UW.

FIG. 3 is a schematic view showing examples of the configuration and signal waveform of the alignment mark AM arranged on the wafer. In FIG. 3, (A) shows an example of the configuration of the alignment mark AM. As shown in (A) of FIG. 3, the alignment mark AM includes, for example, patterns AP1 to AP4. The patterns AP1 and AP2 each include a portion extending in the Y direction, and are arranged in the X direction. The patterns AP3 and AP4 each include a portion extending in the X direction, and are arranged in the Y direction. For example, the coordinate in the X direction of the alignment mark AM is calculated based on the measurement results of the patterns AP1 and AP2, and the coordinate in the Y direction of the alignment mark AM is calculated based on the measurement results of the patterns AP3 and AP4.

In FIG. 3, (B) shows the signal waveform, along the X direction, of the alignment mark AM shown in (A) of FIG. 3, which includes the measurement results of the patterns AP1 and AP2. As shown in (B) of FIG. 3, the signal waveform includes a signal SP1 corresponding to the pattern AP1 and a signal SP2 corresponding to the pattern AP2. Each signal SP can be specified by detecting an edge portion of the signal waveform and the like. Inn this example, the signal strength of each of the signals SP1 and SP2 is higher than the remaining portion. As the X-coordinate of the alignment mark AM, for example, a coordinate corresponding to the intermediate point between the centers of gravity of the signals SP1 and SP2 is used. Similarly, the Y-coordinate of the alignment mark AM can be calculated using the patterns AP3 and AP4. Note that another configuration may be adopted as the configuration of the alignment mark AM, and another calculation method may be used as the method of calculating the position of the alignment mark AM.

<1> First Embodiment

In the bonding processing, a bonding apparatus 1 according to the first embodiment changes a focus setting at the time of alignment based on the deformation amount of the stage holding the lower wafer LW. Details of the bonding apparatus 1 according to the first embodiment will be described below.

<1-1> Configuration

Figure 4:
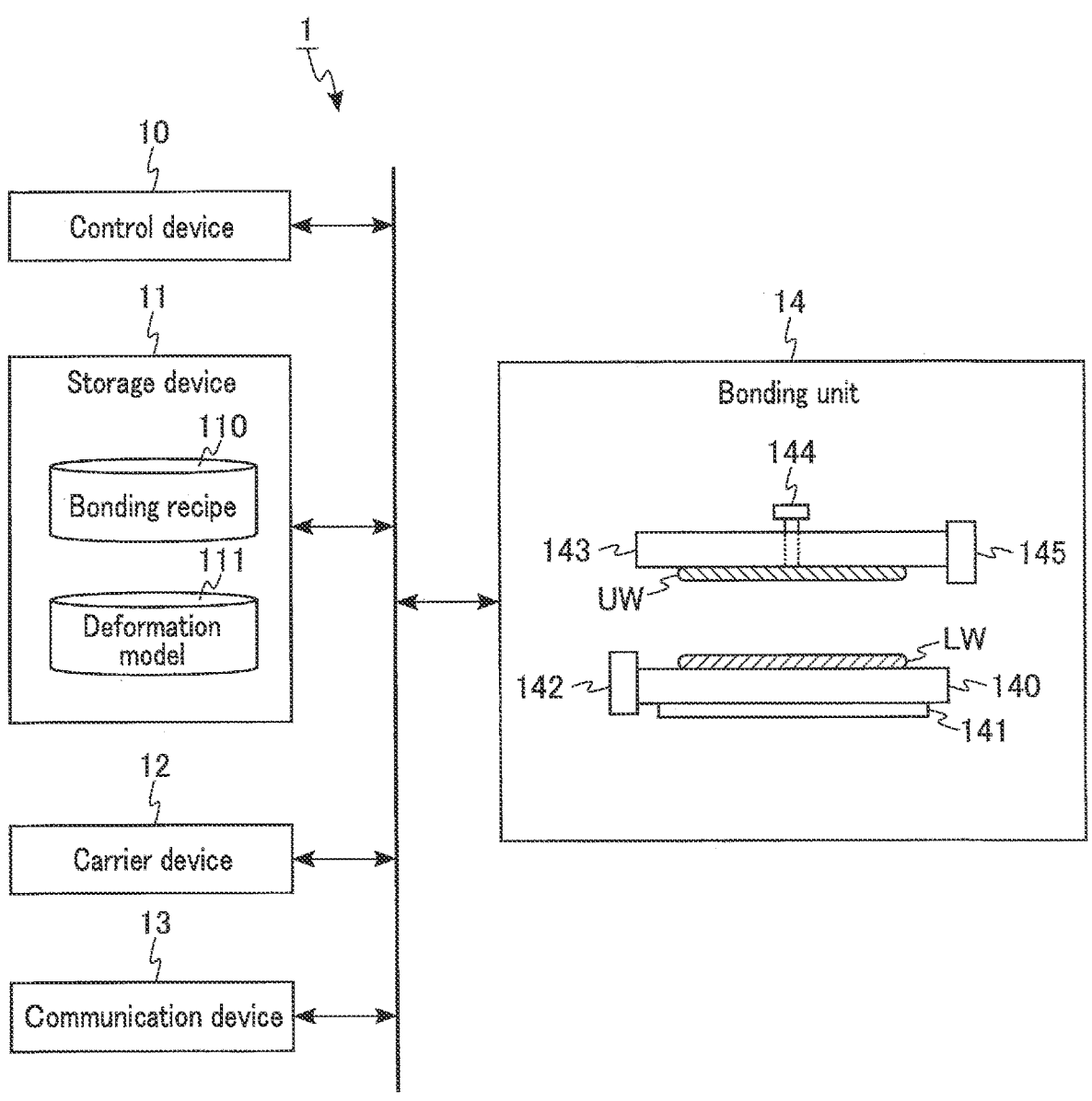
FIG. 4 is a block diagram showing an example of the arrangement of a boding apparatus according to the first embodiment.

FIG. 4 is a block diagram showing an example of the configuration of the bonding apparatus 1 according to the first embodiment. As shown in FIG. 4, the bonding apparatus 1 includes, for example, a control device 10, a storage device 11, a carrier device 12, a communication device 13, and a bonding unit 14.

The control device 10 is a computer or the like that controls the overall operation of the bonding apparatus 1. The control device 10 controls each of the storage device 11, the carrier device 12, the communication device 13, and the bonding unit 14. Although not shown, the control device 10 includes a CPU (Central Processing Unit), a ROM (Read Only Memory), and a RAM (Random Access Memory). The CPU is a processor that executes various programs related to the control of the bonding apparatus. The ROM is a non-volatile storage medium that stores a control program of the bonding apparatus. The RAM is a volatile storage medium that is used as a work area of the CPU. The control device 10 may also be referred to as a "controller".

The storage device 11 is a storage medium that is used to store data, programs, and the like. The storage device 11 stores, for example, a bonding recipe 110 and a deformation model 111. The bonding recipe 110 is a table that records the setting of the bonding processing. The bonding recipe 110 is prepared for each processing process or each processing lot. The setting of the bonding processing includes information of the alignment marks AM to be used and the focus setting at the time of measuring the alignment marks AM. The focus setting is applied to control of a camera used for alignment. The deformation model 111 includes information for estimating, from the deformation amount of a lower stage 140 (to be described later), a best focus BF at the time of measuring the alignment marks AM on the lower wafer LW. Although not shown, the storage device 11 can store the plurality of deformation models 111 associated with alignment correction values. Details of the deformation model 111 will be described later. Note that the storage device 11 may be included in the control device 10.

The carrier device 12 is a device that includes a carrier arm capable of carrying a wafer, and a transition for temporarily placing a plurality of wafers. For example, the carrier device 12 carries, to the bonding unit 14, the upper wafer UW and the lower wafer LW received from a pre-process device of the bonding processing. In addition, after the bonding processing, the carrier device 12 carries the bonded wafer BW received from the bonding unit 14 to the outside of the bonding apparatus 1. The carrier device 12 may include a mechanism for vertically inverting the wafer.

The communication device 13 is a communication interface that can be connected to a network NW. The bonding apparatus 1 may operate under the control of a terminal on the network NW, may store an operation log in a server on the network, or may execute the bonding processing based on information stored in the server.

The bonding unit 14 is a set of components used in the bonding processing. The bonding unit 14 includes, for example, the lower stage 140, a stress device 141, a camera 142, an upper stage 143, a pushpin 144, and a camera 145.

The lower stage 140 has a function of holding the lower wafer LW. The lower stage 140 includes, for example, a wafer chuck that holds the wafer by vacuum suction. For example, the lower stage 140 is configured to be movable in the horizontal direction based on the measurement result of the position of the lower stage 140 by a laser interferometer. The stress device 141 has a function of applying stress to the lower stage 140 and deforming the lower wafer LW via the lower stage 140. The expansion amount (scaling) of the lower wafer LW held by the lower stage 140 changes in accordance with the deformation amount of the lower stage 140 by the stress device 141. More specifically, when the lower stage 140 sucks the lower wafer LW, the peripheral portion of the lower wafer LW drops onto the lower stage 140 and is held by it. Then, the lower wafer LW sucked by the lower stage 140 extends (deforms) along the shape of the deformed lower stage 140. The extension amount (that is, the expansion amount) of the lower wafer LW changes in accordance with the deformation amount of the lower stage 140. The camera 142 is an imaging mechanism that is arranged on the side of the lower stage 140 and is used to measure the alignment marks AM on the upper wafer UW.

The upper stage 143 has a function of holding the upper wafer UW. The upper stage 143 includes, for example, a wafer chuck that holds the wafer by vacuum suction. The upper stage 143 is arranged above the lower stage 140, and is configured to be movable in the vertical direction. The pair of the lower stage 140 and the upper stage 143 is configured to arrange the lower wafer LW held by the lower stage 140 and the upper wafer UW held by the upper stage 143 to face each other. The pushpin 144 is a pin that can be driven in the vertical direction based on the control by the control device 10 to press the upper surface of the center portion of the upper wafer UW held by the upper stage 143. The camera 145 is an imaging mechanism that is arranged on the side of the upper stage 143 and is used to measure the alignment marks AM on the lower wafer LW.

Note that the processing of deforming the lower wafer LW and holding it by the lower stage 140 may be implemented by deforming the lower stage 140 and sucking the lower wafer LW or by sucking the lower wafer LW by the lower stage 140 and deforming the lower stage 140. Similar to the lower stage 140, the upper stage 143 may include a mechanism for deforming the wafer and holding it.

In FIG. 4, the lower surface and upper surface of the lower wafer LW held by the lower stage 140 correspond to the back surface and front surface of the lower wafer LW, respectively. In FIG. 4, the lower surface and upper surface of the upper wafer UW held by the upper stage 143 correspond to the front surface and back surface of the upper wafer UW, respectively. The bonding apparatus 1 can adjust (align) the overlay between the shift component and the rotation component by adjusting the relative position between the lower stage 140 and the upper stage 143. Furthermore, the bonding apparatus 1 can adjust (correct) the wafer magnification of the lower wafer LW held by the deformed lower stage 140 by deforming the lower stage 140 by the stress device 141.

Note that the bonding apparatus 1 may have a vacuum pump that is used for vacuum suction by the lower stage 140 and the upper stage 143. The stress device 141 may be referred to as a "stress generator". The camera 142 may be referred to as an alignment sensor having a function of measuring the position of the upper stage 143. The camera 145 may be referred to as an alignment sensor having a function of measuring the position of the lower stage 140. Each of the cameras 142 and 145 may include a moving portion that is driven in the vertical direction (optical axis direction) to adjust the focus.

Note that the above-described "pre-process device of bonding processing" is a device having a function of modifying and hydrophilizing the bonding surfaces of the upper wafer UW and the lower wafer LW so as to be bonded, before the bonding processing. In brief, the pre-process device first executes plasma processing on the respective front surfaces of the upper wafer UW and the lower wafer LW and modifies the respective front surfaces of the upper wafer UW and the lower wafer LW. In the plasma processing, oxygen ions or nitrogen ions are generated based on oxygen gas or nitrogen gas as treatment gas under a predetermined reduced pressure atmosphere, and the generated oxygen ions or nitrogen ions are applied to the bonding surface of each wafer. Thereafter, the pre-process device supplies pure water to the respective front surfaces of the upper wafer UW and the lower wafer LW. Then, hydroxyl groups adhere to the respective front surfaces of the upper wafer UW and the lower wafer LW, and the front surfaces are hydrophilized. In the bonding processing, the upper wafer UW and the lower wafer LW whose bonding surfaces have been modified and hydrophilized as described above are used. The bonding apparatus 1 may be combined with the pre-process device and the like to constitute a bonding system.

<1-2> Method of Manufacturing Semiconductor Device

As a method of manufacturing a semiconductor device according to the first embodiment, an example of practical processing using the bonding apparatus 1 will be described below. That is, a semiconductor device is manufactured using the bonding method (bonding processing) of the first embodiment to be described below.

<1-2-1> Overview of Bonding Processing

FIG. 5 is a schematic view showing an overview of the bonding processing by the bonding apparatus 1 according to the first embodiment. In FIG. 5, each of (A) to (H) shows the state of the bonding unit 14 in the bonding processing. An overview of the bonding processing will be described below with reference to FIG. 5.

In FIG. 5, (A) shows the state of the bonding unit 14 before the bonding processing. Upon receiving an execution instruction of the bonding processing and the pair of the upper wafer UW and the lower wafer LW associated with each other, the bonding apparatus 1 starts the bonding processing.

After starting the bonding processing, the lower stage 140 is deformed ((B) of FIG. 5: deformation of lower stage). More specifically, the control device 10 controls the stress device 141 based on the alignment correction value to deform the lower stage 140. The alignment correction value to be referred to by the control device 10 may be acquired from an external server or may be calculated based on the alignment correction value acquired from the exposure apparatus or the server. Note that depending on the alignment correction value, a state in which the stress device 141 applies no stress to the lower stage 140 and thus the lower stage 140 is not deformed may be set at the time of the processing shown in (B) of FIG. 5.

Next, the upper wafer UW is loaded ((C) of FIG. 5: loading of upper wafer). More specifically, the control device 10 causes the carrier device 12 to carry the upper wafer UW to the upper stage 143. Then, the control device 10 causes the upper stage 143 to hold the upper wafer UW by vacuum suction. Note that the front surface of the upper wafer UW loaded by the bonding apparatus 1 is modified and hydrophilized by the pre-process device.

Next, the alignment processing of the upper wafer UW is executed ((D) of FIG. 5: alignment of upper wafer). More specifically, the control device 10 measures the alignment marks AM_C, AM_L, and AM_R on the upper wafer UW using the camera 142, and calculates the coordinate points of the alignment marks AM.

Next, the lower wafer LW is loaded ((E) of FIG. 5: loading of lower wafer). More specifically, the control device 10 causes the carrier device 12 to carry the lower wafer LW to the lower stage 140. Then, the control device 10 causes the lower stage 140 to hold the lower wafer LW by vacuum suction. At this time, if the stress device 141 applies no stress to the lower stage 140, the lower wafer LW is held by the lower stage 140 in a flat state. On the other hand, if the stress device 141 applies stress to the lower stage 140, the lower wafer LW is deformed along the shape of the lower stage 140 deformed by the stress device 141. Note that the front surface of the lower wafer LW loaded by the bonding apparatus 1 is modified and hydrophilized by the pre-process device.

Next, the alignment processing of the lower wafer LW is executed ((F) of FIG. 5: alignment of lower wafer). More specifically, the control device 10 measures the alignment marks AM_C, AM_L, and AM_R on the lower wafer LW using the camera 145, and calculates the coordinate points of the alignment marks AM. When measuring the alignment marks AM_C, AM_L, and AM_R on the lower wafer LW, the deformation model 111 created in advance is used.

Next, origin alignment of the cameras 142 and 145 is executed ((G) of FIG. 5: origin alignment of cameras). More specifically, the control device 10 controls the positions of the lower stage 140 and the upper stage 143, and inserts a common target 146 between the optical axis of the camera 142 and that of the camera 145. Then, the control device 10 aligns the origins of the cameras 142 and 145 based on the measurement results of the common target 236 by the cameras 142 and 145.

Next, a bonding sequence is executed ((H) of FIG. 5: bonding sequence). More specifically, first, the control device 10 adjusts the relative position between the lower stage 140 and the upper stage 143 based on the alignment results of the upper wafer UW and the lower wafer LW and the result of origin alignment of the cameras 142 and 145. Then, the control device 10 brings the position of the upper stage 143 close to the lower stage 140 to adjust the interval between the upper wafer UW and the lower wafer LW. Thereafter, the control device 10 pushes down the center portion of the upper wafer UW by lowering the pushpin 144, thereby bringing the front surface of the upper wafer UW into contact with the front surface of the lower wafer LW.

Thereafter, the control device 10 sequentially releases the holding (vacuum suction) of the upper wafer UW by the upper stage 143 from the inside to the outside. Then, the upper wafer UW drops onto the lower wafer LW, and the front surface of the upper wafer UW and that of the lower wafer LW are bonded. More specifically, a van der Waals force (intermolecular force) is generated between the modified bonding surface of the upper wafer UW and the modified bonding surface of the lower wafer LW, and the contact portions of the upper wafer UW and the lower wafer LW are bonded. Furthermore, because the respective bonding surfaces of the upper wafer UW and the lower wafer LW are hydrophilized, the hydrophilic groups in the contact portions of the upper wafer UW and the lower wafer LW are hydrogen-bonded, and the contact portions of the upper wafer UW and the lower wafer LW are more firmly bonded.

<1-2-2> Method of Creating Deformation Model 111

Figure 6:
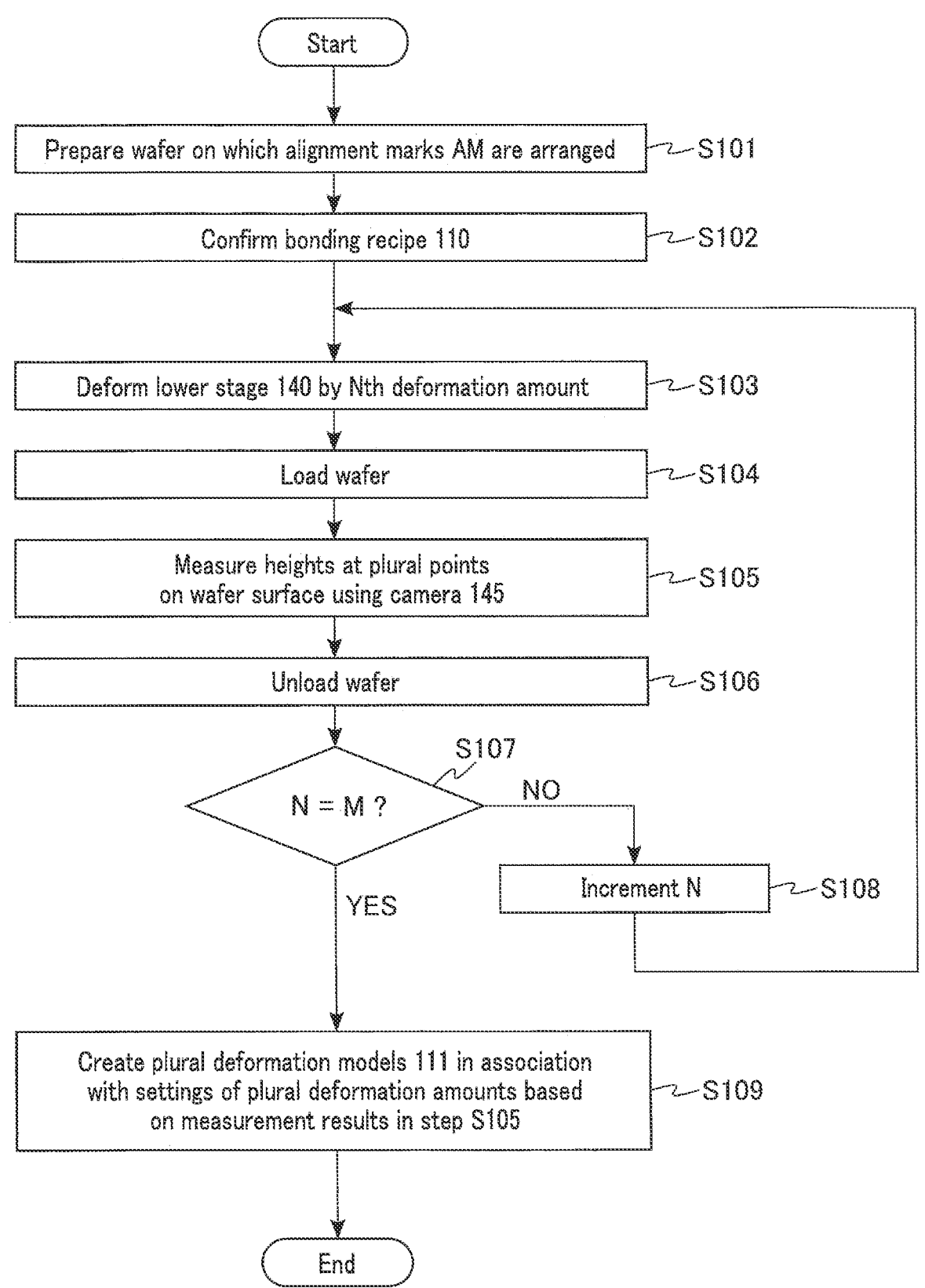
FIG. 6 is a flowchart illustrating an example of a method of creating a deformation model to be used by the bonding apparatus according to the first embodiment.

FIG. 6 is a flowchart illustrating an example of a method of creating the deformation model 111 to be used by the bonding apparatus according to the first embodiment. The procedure of the method of creating the deformation model 111 in the bonding apparatus 1 according to the first embodiment will be described below with reference to FIG. 6.

A wafer on which the alignment marks AM are arranged is prepared (step S101). As for the wafer prepared in step S101, the structure of a portion in which the alignment marks AM are provided is the same as that of the lower wafer LW at the time of the bonding processing. That is, in the processing in step S101, a wafer as a creation target of the deformation model 111 is preferably prepared. The creation target of the deformation model 111 may be a wafer deformed by the bonding apparatus 1 at the time of the bonding processing, and may be either the upper wafer UW or the lower wafer LW.

Next, the control device 10 confirms the bonding recipe 110 (step S102). The bonding recipe 110 at the time of creating the deformation model 111 includes information of the coordinate points of the plurality of alignment marks AM on the wafer prepared in step S101 and the setting of the deformation amount of the lower stage 140.

Next, the control device 10 deforms the lower stage 140 by the Nth deformation amount (step S103). "N" is an integer of 2 or more. "N" is set to, for example, "1" as the initial value of the series of processes shown in FIG. 6. The control device 10 applies the Nth deformation amount to the lower stage 140 by causing the stress device 141 to apply, to the lower stage 140, stress corresponding to the Nth deformation amount. Note that in this example, the first deformation amount corresponds to a state in which no correction is performed by the stress device 141. The deformation amount of the wafer is indicated by the height of the center portion of the wafer if, for example, the height of the peripheral portion of the wafer is set as a reference. As the unit of the deformation amount, for example, micrometer (μm) is used. The deformation amount of the wafer may be represented by the magnitude of the stress applied to the wafer by the stress device 141. As the unit of the stress, for example, Mega Pascal (MPa) is used.

Next, the control device 10 loads the wafer (step S104). In this example, under the control of the control device 10, the lower wafer LW is carried to the lower stage 140 and is vacuum-sucked by the lower stage 140. At this time, the lower wafer LW is deformed based on the shape of the lower stage 140 deformed by the stress device 141. Note that if no correction is performed by the stress device 141, the lower wafer LW is held in the flat state.

Next, the control device 10 measures heights at a plurality of points on the wafer surface using the camera 145 (step S105). In this example, the "plurality of points" respectively correspond to the plurality of alignment marks AM, and the "height" corresponds to the position of the focus. More specifically, in the processing in step S105, the control device 10 controls the horizontal position of the lower stage 140 to align the optical axis of the camera 145 of the upper stage 143 with the position of the alignment mark AM on the lower wafer LW. Then, the camera 145 measures each alignment mark AM using a predetermined focus range and a predetermined focus step. Then, the control device 10 decides the best focus (height) for each alignment mark AM based on the measurement result of the camera 145.

Next, the control device 10 unloads the wafer (step S106). In this example, the carrier device 12 receives the lower wafer LW for which vacuum suction by the lower stage 140 has been released.

Next, the control device 10 determines whether "m=M" is satisfied (step S107). "M" corresponds to the number of deformation models 111 created in correspondence with the deformation amounts of the wafer (that is, the wafer magnification correction values). Note that the processing in step S107 may be said as processing in which the control device 10 determines whether the setting of the deformation amount of the wafer for which the measurement result has not been obtained in step S105 remains.

If, in the processing in step S107, "m=M" is not satisfied (NO in step S107), the control device 10 increments "m" (step S108), and returns to the processing in step S103. That is, the control device 10 executes the processes in steps S104 and S105 in a state in which the deformation amount of the lower stage 140 in the processing in step S103, that is, the deformation amount of the lower wafer LW sucked by the lower stage 140 is changed. The control device 10 can generate information of the best focus associated with each deformation amount by repeating the processes in steps S103 to S108. Note that the processing in step S108 may be said as processing in which the control device 10 selects the setting of the deformation amount of the wafer for which the measurement result has not been obtained in step S105.

If, in the processing in step S107, "N=M" is satisfied (YES in step S107), the control device 10 creates the plurality of deformation models 111 in association with the settings of the plurality of deformation amounts based on the measurement results in step S105 (step S109). More specifically, the control device 10 creates the deformation model 111 associated with the first deformation amount from the measurement results obtained in step S105 with respect to the first deformation amount. Similarly, the control device 10 creates the plurality of deformation models 111 respectively associated with the second to Mth deformation amounts. Note that since the deformation model 111 is calculated based on the best focus position (height) of each alignment mark AM, it may be referred to as a "focus map". The deformation model 111 is calculated by, for example, performing a polynomial approximation using the value of best focus of each alignment mark AM.

Note that with respect to the deformation model 111 corresponding to the deformation amount which has not been measured in the processing in step S105, the control device 10 may perform estimation from the deformation model 111 using a close deformation amount or the deformation model 111 under a plurality of conditions including the deformation amount. Then, using the deformation model 111 associated with the deformation amount of the lower stage 140, the control device 10 can calculate, from the coordinate point of the lower wafer LW vacuum-sucked by the lower stage 140, the height of the alignment mark AM at the coordinate point. After the completion of the processing in step S109, the control device 10 ends the series of processes shown in FIG. 6.

(Practical Example of Method of Creating Deformation Model 111)

Figure 7:
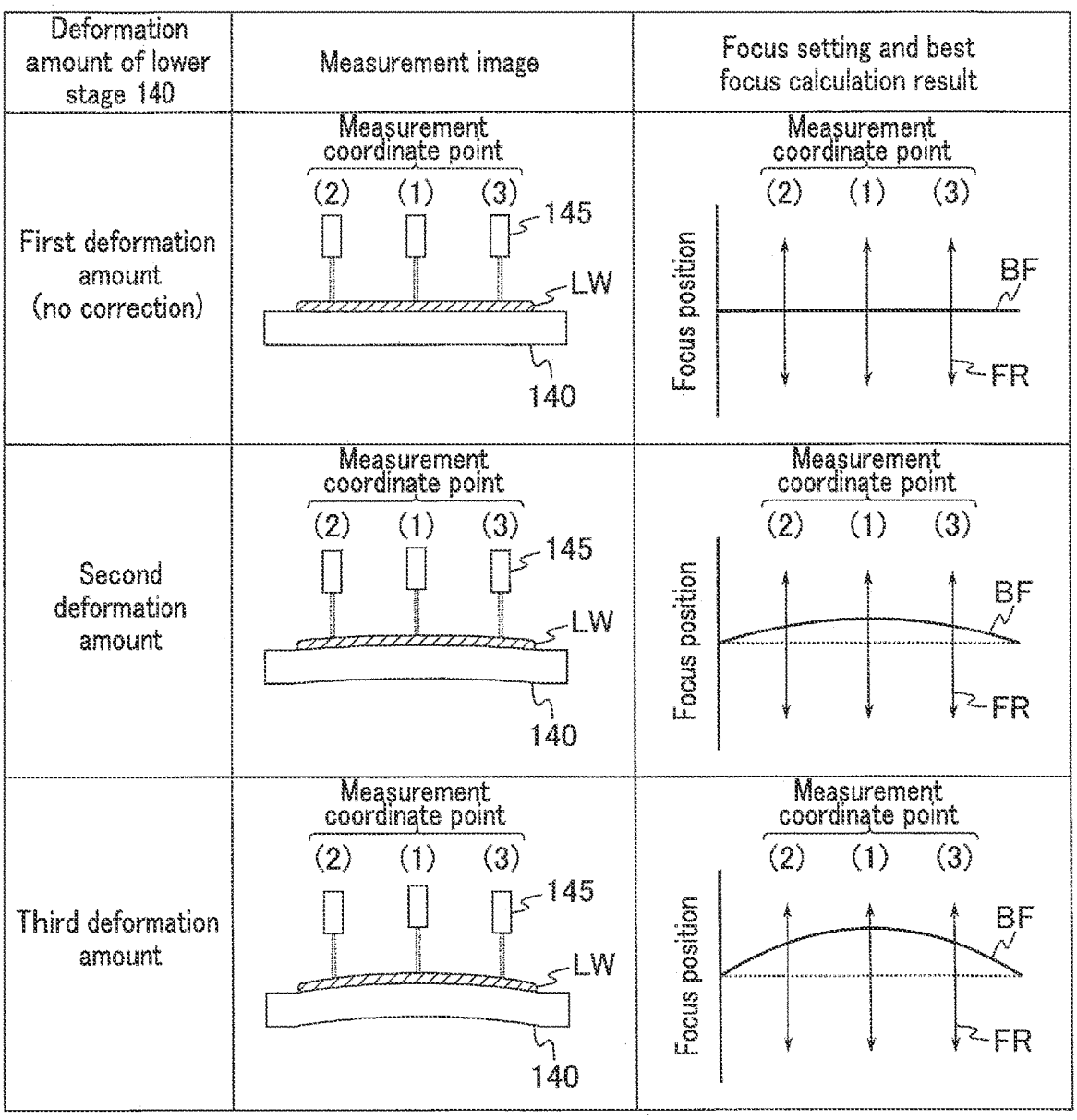
FIG. 7 is a schematic view showing a practical example of the method of creating the deformation model to be used by the bonding apparatus according to the first embodiment.

FIG. 7 is a schematic view showing a practical example of the method of creating the deformation model 111 to be used by the bonding apparatus according to the first embodiment. FIG. 7 shows, for each deformation amount of the lower stage 140, the measurement image of the lower wafer LW on the lower stage 140 and the focus setting and best focus calculation result. The first deformation amount for m=1 corresponds to the state in which no correction of the wafer magnification is performed for the lower stage 140. The second deformation amount for m=2 corresponds to the state in which the lower stage 140 is deformed by the stress device 141. The third modification amount for m=3 corresponds to the state in which the lower stage 140 is deformed by the stress device 141 by an amount larger than the second deformation amount. The numerals of coordinate points (1), (2) and (3) shown in FIG. 7 correspond to an example of the measurement order. The coordinate points (1), (2) and (3) correspond to, for example, the alignment marks AM_C, AM_L, and AM_R, respectively.

If the deformation amount of the lower stage 140 is the first deformation amount (no correction), the lower wafer LW vacuum-sucked by the lower stage 140 is held in the flat state. That is, the camera 145 of the upper stage 143 captures, under the condition based on the predetermined focus setting, the alignment mark AM arranged on the lower wafer LW in the flat state. In this case, the best focuses BF decided based on the measurement of the alignment marks AM at the coordinate points (1), (2), and (3) can be at almost the same position (height). Therefore, the deformation model 111 associated with the first deformation amount can be an approximation indicating almost the same value regardless of the coordinate point.

If the deformation amount of the lower stage 140 is the second deformation amount, the lower wafer LW vacuum-sucked by the lower stage 140 is held in the state in which the lower wafer LW is deformed in a convex shape. That is, the camera 145 of the upper stage 143 captures, under the condition based on the predetermined focus setting, the alignment mark AM arranged on the lower wafer LW in the state in which the lower wafer LW is deformed in the convex shape. In this case, the position of the best focus BF at the coordinate point (1) arranged in the center portion is higher than the positions of the best focuses BF at the coordinate points (2) and (3) arranged in the peripheral portion. Therefore, the deformation model 111 associated with the second deformation amount can be an approximation indicating a higher value as the position is closer to the center of the wafer.

If the deformation amount of the lower stage 140 is the third deformation amount, the lower wafer LW vacuum-sucked by the lower stage 140 is held in the state in which the lower wafer LW is deformed, in a convex shape, more than in the case of the second deformation amount. That is, the camera 145 of the upper stage 143 captures, under the condition based on the predetermined focus setting, the alignment mark AM arranged on the lower wafer LW in the state in which the lower wafer LW is deformed, in the convex shape, more than in the case of the second deformation amount. In this case, the positions of the best focuses BF at the coordinate points (1), (2), and (3) can be higher than the positions of the best focuses BF at the coordinate points (1), (2), and (3) in the case of the second deformation amount. Therefore, the deformation model 111 associated with the third deformation amount can be an approximation indicating a higher value as the position is closer to the center of the wafer, as compared with the case of the second deformation amount.

At the time of creating the deformation model 111, a focus range FR when measuring the alignment mark AM at each of the coordinate points (1), (2), and (3) is preferably set to a wide range. The focus range FR corresponds to the range of the position (height) at which the alignment mark AM is captured at the measurement point of the alignment mark AM. In measurement of the alignment mark AM, imaging is executed a plurality of times based on the preset focus step within the focus range FR. The "wide range" described here corresponds to the focus setting that includes the best focus BF even if the lower stage 140 has any deformation amount at each coordinate point. By setting the focus range FR to the wide range, occurrence of re-measurement of the focus if the best focus BF is not detected within the focus range FR can be suppressed.

<1-2-3> Alignment Processing of Lower Wafer LW

FIG. 8 is a flowchart illustrating details of an example of the alignment processing ((F) of FIG. 5) of the lower wafer LW included in the bonding processing by the bonding apparatus 1 according to the first embodiment. The procedure of the alignment processing of the lower wafer LW by the bonding apparatus 1 according to the first embodiment will be described below with reference to FIG. 8.

If the alignment processing of the lower wafer LW according to the first embodiment starts, the control device 10 calculates the focus position (height) at each measurement coordinate point based on the deformation model 111 corresponding to the deformation amount of the lower stage 140 (step S111). In other words, in the processing in step S111, the control device 10 selects (uses) the deformation model 111 associated with the wafer magnification correction value applied to the lower wafer LW, and calculates the focus position at each measurement coordinate point. Furthermore, in other words, in the processing in step S111, the control device 10 estimates (calculates) the best focus based on the deformation model 111 of the lower wafer LW in a region where the camera 145 executes calibration of the focus.

Next, the control device 10 searches for the best focus at the coordinate point (1) within the focus range including the focus position calculated at the coordinate point (1) in the processing in step S111 and narrower than that at the time of generating the deformation model 111 (step S112). In the processing in step S112, the best focus at the coordinate point (1) is decided.

Next, the control device 10 measures the alignment mark AM_C with the setting of the best focus decided in step S112 (step S113).

Next, the control device 10 searches for the best focus at the coordinate point (2) within the focus range including the focus position calculated at the coordinate point (2) in the processing in step S111 and narrower than that at the time of generating the deformation model 111 (step S114). In the processing in step S114, the best focus at the coordinate point (2) is decided.

Next, the control device 10 measures the alignment mark AM_L with the setting of the best focus decided in step S114 (step S115).

Next, the control device 10 searches for the best focus at the coordinate point (3) within the focus range including the focus position calculated at the coordinate point (3) in the processing in step S111 and narrower than that at the time of generating the deformation model 111 (step S116). In the processing in step S116, the best focus at the coordinate point (3) is decided.

Next, the control device 10 measures the alignment mark AM_R with the setting of the best focus decided in step S116 (step S117).

Next, the control device 10 adjusts the position of the lower stage 140 based on the measurement results obtained in steps S113, S115, and S117 (step S118). After the completion of the processing in step S118, the control device 10 completes the alignment processing of the lower wafer LW, and advances to the next processing in the bonding processing.

Note that the bonding apparatus 1 according to the first embodiment may integrate the processes in steps S112 and S113, the processes in steps S114 and S115, and the processes in steps S116 and S117, respectively. Note that the bonding apparatus 1 according to the first embodiment decides at least the focus setting such as the focus range FR and the focus step based on the deformation model 111 corresponding to the deformation amount of the lower stage 140.

(Practical Example of Method of Measuring Alignment Mark AM)

Figure 9:
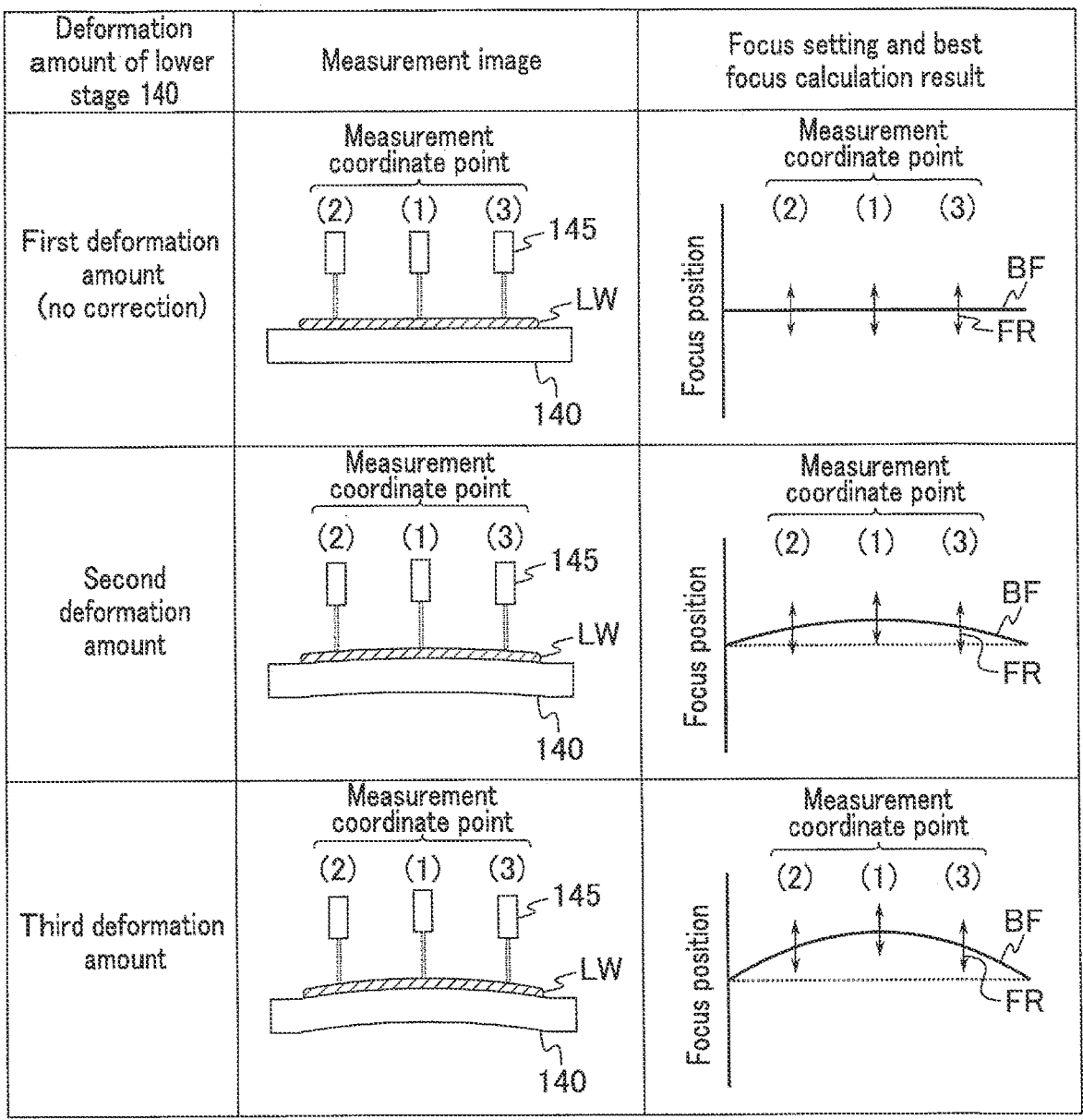
FIG. 9 is a schematic view showing a practical example of a method of measuring an alignment mark in the alignment processing of the lower wafer LW included in the bonding processing by the bonding apparatus according to the first embodiment.

FIG. 9 is a schematic view showing a practical example of a method of measuring the alignment mark AM in the alignment processing of the lower wafer LW included in the bonding processing by the bonding apparatus 1 according to the first embodiment. FIG. 9 shows, for each deformation amount of the lower stage 140, the measurement image of the lower wafer LW on the lower stage 140 and the focus setting and best focus calculation result. The measurement image if the deformation amount of the lower stage 140 is the first deformation amount (no correction), that if the deformation amount of the lower stage 140 is the second deformation amount, and that if the deformation amount of the lower stage 140 is the third deformation amount are the same as those described with reference to FIG. 7. The focus setting for each deformation amount is different between FIGS. 9 and 7.

As shown in FIG. 9, the focus range FR at each measurement coordinate point if the deformation amount of the lower stage 140 is the first deformation amount (no correction) includes the best focus BF indicated by the deformation model 111 corresponding to the first deformation amount, and is set narrower than that at the time of generating the deformation model 111. In the focus setting associated with the first deformation amount, the positions of the focus ranges FR at the coordinate points (1), (2), and (3) are set at almost equal heights.

The focus range FR at each measurement coordinate point if the deformation amount of the lower stage 140 is the second deformation amount includes the best focus BF indicated by the deformation model 111 corresponding to the second deformation amount, and is set narrower than that at the time of generating the deformation model 111. In the focus setting associated with the second deformation amount, the positions of the focus ranges FR at the coordinate points (1), (2), and (3) are shifted and set higher than in the focus setting associated with the first deformation amount. Furthermore, based on the deformation model 111 associated with the second deformation amount, the position of the focus range FR at the coordinate point (1) is shifted and set higher, as compared with the coordinate points (2) and (3).

The focus range FR at each measurement coordinate point if the deformation amount of the lower stage 140 is the third deformation amount includes the best focus BF indicated by the deformation model 111 corresponding to the third deformation amount, and is set narrower than that at the time of generating the deformation model 111. In the focus setting associated with the third deformation amount, the positions of the focus ranges FR at the coordinate points (1), (2), and (3) are shifted and set higher than in the focus setting associated with the second deformation amount. Furthermore, based on the deformation model 111 associated with the third deformation amount, the position of the focus range FR at the coordinate point (1) is shifted and set higher, as compared with the coordinate points (2) and (3).

<1-3> Effect of First Embodiment

With the bonding apparatus 1 according to the first embodiment described above, it is possible to improve the performance of the bonding apparatus. Details of the effect of the first embodiment will be described below.

When confirming the position of the stage holding the wafer, the bonding apparatus 1 measures the alignment marks AM on the wafer. At this time, for example, the bonding apparatus 1 executes calibration of the focus by vertically driving the main body of the camera 145 or a lens in the camera 145. As the function of the bonding apparatus 1, a function of correcting the wafer magnification by deforming the lower stage 140 is known.

If the wafer magnification is corrected in the bonding apparatus 1, the best focus position of the alignment mark AM is changed along with the deformation of the lower stage 140. To cope with this, it is considered to set a wide focus calibration range (focus range) so that the best focus of the alignment mark AM can be detected even if the wafer magnification is changed. However, if the wide focus range is set, the measurement time of the alignment mark AM increases, thereby degrading the throughput of the bonding apparatus.

To cope with this, the bonding apparatus 1 according to the first embodiment creates in advance the deformation model 111 by associating, with each other, the deformation amount of the lower stage 140 and the tendency of the best focus position of the lower wafer LW on the wafer surface. Then, the bonding apparatus 1 executes the alignment processing of the lower wafer LW using the focus setting based on the deformation amount of the lower stage 140 and the deformation model 111 of the wafer. For example, the bonding apparatus 1 can predict, in advance, the best focus position at the measurement coordinate point in accordance with the deformation amount of the lower stage 140, thereby setting a narrow focus range when calibrating the focus at the time of the alignment processing.

As a result, the bonding apparatus 1 according to the first embodiment can shorten the measurement time of the alignment mark AM, thereby improving the throughput of the bonding apparatus 1. That is, the bonding apparatus 1 according to the first embodiment can improve the performance of the bonding apparatus.

Note that the bonding apparatus 1 according to the first embodiment may set the narrow focus range FR, and set the focus step more finely than that at the time of creating the deformation model 111. If the focus step is set finely, the measurement time of the alignment mark AM increases along with an increase in the number of times of imaging by the camera 145. On the other hand, if the focus step is set finely, the detection accuracy of the best focus position can be improved. That is, the bonding apparatus 1 according to the first embodiment can adjust the balance between the throughput and the focus accuracy by causing the user to select the settings of the focus range FR and the focus step in the focus setting based on the deformation model 111.

<1-4> Modification of First Embodiment

In the method of creating the deformation model 111 described with reference to FIG. 6, processing of reloading the wafer when changing the deformation amount of the lower stage 140 may be omitted. FIG. 10 is a flowchart illustrating a modification of the method of creating the deformation model 111 to be used by the bonding apparatus 1 according to the first embodiment. The procedure of the method of creating the deformation model 111 according to the modification of the first embodiment will be described below with reference to FIG. 10.

First, a wafer on which the alignment marks AM are arranged is prepared (step S101). The bonding recipe 110 is confirmed (step S102). The wafer is loaded (step S104). The lower stage 140 is deformed by the Nth deformation amount (step S103). Heights at a plurality of points on the wafer surface are measured using the camera 145 (step S105). Then, it is determined whether "m=M" is satisfied (step S107).

If, in the processing in step S107, "m=M" is not satisfied (NO in step S107), "m" is incremented (step S108), and the processes in steps S103 and S105 are executed. That is, the deformation amount of the lower stage 140 is changed in the state in which the wafer is vacuum-sucked by the lower stage 140, and the heights at the plurality of points on the wafer surface are measured.

If, in the processing in step S107, "m=M" is satisfied (YES in step S107), the wafer is unloaded (step S106). Then, the deformation model 111 of the wafer associated with the deformation amount of the lower stage 140 is created based on the measurement results obtained in step S105 (step S109). After the completion of the processing in step S109, the series of processes shown in FIG. 10 ends.

As described above, the order of the processes for creating the deformation model 111 may be changed or some of the processes may be omitted. In this case as well, the bonding apparatus 1 can create the deformation model 111, similar to the first embodiment.

<2> Second Embodiment

A bonding apparatus 1 according to the second embodiment changes the setting of the optical axis of a camera 145 based on the deformation amount of a lower stage 140 and a measurement coordinate point in alignment processing of a lower wafer LW at the time of bonding processing. Details of the bonding apparatus 1 according to the second embodiment will be described below.

Figures 11, 12:
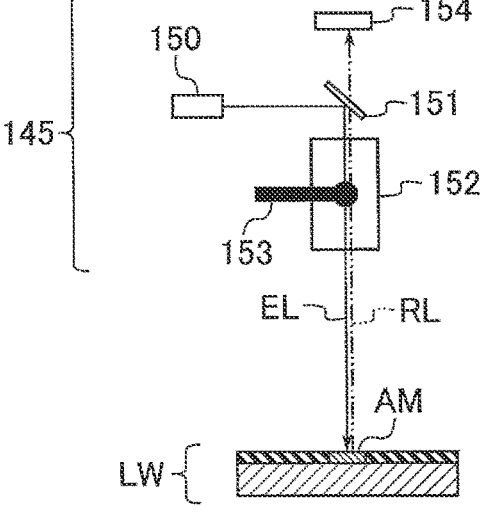
FIG. 11 is a schematic view showing examples of the relationship between an optical axis and a signal waveform at the time of the alignment processing.
FIG. 12 is a schematic view showing an example of the detailed configuration of a camera provided in a bonding apparatus according to the second embodiment.

<2-1> Relationship Between Optical Axis and Signal Waveform at Time of Alignment Processing FIG. 11 is a schematic view showing the relationship between the optical axis and the signal waveform at the time of the alignment processing. FIG. 11 shows the measurement image of the lower wafer LW on the lower stage 140 and the signal waveform of one pattern AP in each of a case in which the lower stage 140 is not deformed and a case in which the lower stage 140 is deformed. Coordinate points (1), (2), and (3) shown in FIG. 11 correspond to, for example, alignment marks AM_C, AM_L, and AM_R, respectively. In the signal waveform, "DF" corresponds to defocusing, and "BF" corresponds to a best focus.

If the lower stage 140 is not deformed, the lower wafer LW vacuum-sucked by the lower stage 140 is held in a flat state. In this case, the tilt of the optical axis of the camera 145 of an upper stage 143 is vertical with respect to the front surface of the lower wafer LW. In this case, the signal waveform of the one pattern AP can be symmetrical for any of the alignment marks AM_C, AM_L, and AM_R. If the signal waveform is symmetrical, even if defocusing in either the positive direction or the negative direction occurs, a change in the position of the center of gravity of the signal waveform is suppressed. Therefore, a control device 10 can detect the best focus BF based on the signal strength.

On the other hand, if the lower stage 140 is deformed, the lower wafer LW vacuum-sucked by the lower stage 140 is held in a state in which the lower wafer LW is deformed in a convex shape conforming with the lower stage 140. In this case, an angle formed by the optical axis of the camera 145 of the upper stage 143 and the front surface of the lower wafer LW departs from the right angle as the distance from the center portion (coordinate point (1)) of the lower wafer LW is longer. In each of measurement of the alignment mark AM_L at the coordinate point (2) and measurement of the alignment mark AM_R at the coordinate point (3), the alignment mark AM is measured from the oblique direction. As a result, the signal waveform of each of the alignment marks AM_L and AM_R can be asymmetrical.

If the signal waveform is asymmetrical, the detection accuracy of the alignment mark AM deteriorates. More specifically, the position of the center of gravity of the signal waveform of the one pattern AP changes in the opposite direction between defocusing DFp in the positive direction and defocusing DFm in the negative direction. Then, the possibility that the control device 10 erroneously detects the peak of the signal waveform is high, and the coordinate point of the alignment mark AM calculated based on the measurement result may be shifted. To cope with this, the bonding apparatus 1 according to the second embodiment has a function of adjusting the optical axis of the camera 145 for each measurement coordinate point.

<2-2> Configuration of Camera 145

FIG. 12 is a schematic view showing an example of the detailed configuration of the camera 145 provided in the bonding apparatus 1 according to the second embodiment. FIG. 12 also shows the alignment mark AM on the lower wafer LW as the measurement target of the camera 145. As shown in FIG. 12, the camera 145 includes, for example, a light source 150, an optical element 151, a lens unit 152, a support portion 153, and a light receiving portion 154.

The light source 150 is a semiconductor device that can emit a laser beam. The laser beam emitted by the light source 150 will be referred to as emitted light EL hereinafter. The camera 145 may include a plurality of light sources, and the wavelength of the emitted light EL may be used in accordance with the configuration of the measurement target (alignment mark AM).

The optical element 151 is, for example, a half mirror. The optical element 151 reflects, to the lens unit 152, the laser beam (emitted light EL) emitted from the light source 150. The optical element 151 transmits the laser beam having passed through the lens unit 152.

The lens unit 152 is an optical system that guides the emitted light EL to the measurement target (for example, the lower wafer LW). The lens unit 152 guides, to the light receiving portion 154 via the optical element 151, reflected light RL obtained when the emitted light EL emitted to the lower wafer LW is reflected by the front surface of the lower wafer LW. The optical axis of the lens unit 152 corresponds to the optical axis of the camera 145.

The support portion 153 supports the lens unit 152 and has a mechanism that can adjust the tilt of the optical axis of the lens unit 152. Note that in the camera 145, the relative positions of the light source 150, the optical element 151, and the light receiving portion 154 with respect to the lens unit 152 can be changed in accordance with the tilt of the optical axis of the lens unit 152 changed by the support portion 153.

The light receiving portion 154 is a sensor that can detect the reflected light RL. The light receiving portion 154 is arranged on, for example, the optical axis of the lens unit 152. The light receiving portion 154 may be arranged at a position where at least the reflected light RL can be detected.

The remaining components of the bonding apparatus 1 according to the second embodiment are the same as in the first embodiment. Note that the camera 145 may have another configuration. For example, in the camera 145, the configuration positions of the light source 150 and the light receiving portion 154 may be interchanged.

<2-3> Method of Manufacturing Semiconductor Device

As a method of manufacturing a semiconductor device according to the second embodiment, an example of practical processing using the bonding apparatus 1 will be described below. That is, a semiconductor device is manufactured using a bonding method (bonding processing) of the second embodiment to be described below. Note that an overview of the bonding processing by the bonding apparatus 1 according to the second embodiment is the same as in the first embodiment.

<2-3-1> Method of Correcting Optical Axis

Figure 13:
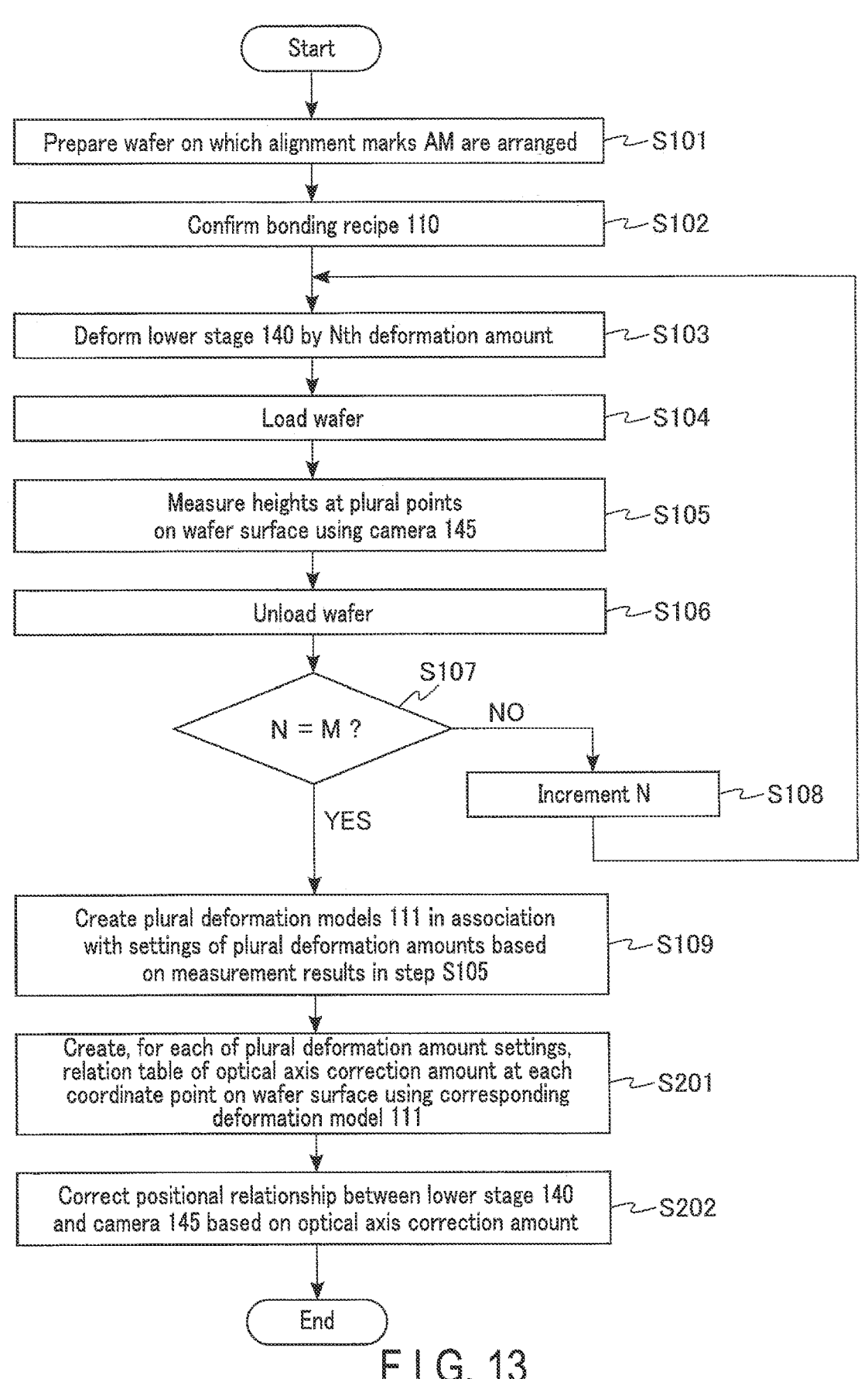
FIG. 13 is a flowchart illustrating an example of a method of creating a deformation model to be used by the bonding apparatus according to the second embodiment.

FIG. 13 is a flowchart illustrating an example of a method of correcting the optical axis to be used by the bonding apparatus 1 according to the second embodiment. The procedure of the method of correcting the optical axis in the bonding apparatus 1 according to the second embodiment will be described below with reference to FIG. 13.

Similar to the method of creating a deformation model 111 described with reference to FIG. 6 in the first embodiment, processes in steps S101 to S109 are executed. That is, a wafer on which the alignment marks AM are arranged is prepared (step S101). A bonding recipe 110 is confirmed (step S102). The lower stage 140 is deformed by the Nth deformation amount (step S103). The wafer is loaded (step S104). Heights at a plurality of points on the wafer surface are measured using the camera 145 (step S105). The wafer is unloaded (step S106). Then, it is determined whether "N=M" is satisfied (step S107). If, in the processing in step S107, "m=M" is not satisfied (NO in step S107), "N" is incremented (step S108), and the processing in step S103 is executed. If, in the processing in step S107, "N=M" is satisfied (YES in step S107), a plurality of deformation models 111 are created in association with a plurality of deformation amount settings, respectively, based on the measurement results in step S105 (step S109).

After the completion of the processing in step S109, the control device 10 creates, for each of the plurality of deformation amount settings, a relation table of an optical axis correction amount at each coordinate point on the wafer surface using the corresponding deformation model 111 (step S201). The relation table of the optical axis correction amount includes information for associating information of the measurement coordinate point and the optical axis correction amount with each other. The optical axis correction amount is set so that the optical axis of the camera 145 is vertical with respect to the direction of the front surface of the lower wafer LW calculated based on the deformation model 111 at each measurement coordinate point. In other words, the optical axis of the camera 145 is set in a direction orthogonal to the tilt of the front surface of the lower wafer LW at the measurement coordinate point calculated based on the deformation model 111. The optical axis correction amount may be indicated by the rotation amount of the lens unit 152 from the default state or by the control parameter of the support portion 153.

Next, the control device 10 corrects the positional relationship (relative position) between the lower stage 140 and the camera 145 based on the optical axis correction amount (step S202). In the processing in step S202, the control device 10 adjusts the position of the camera 145 so that the corrected optical axis coincides with the position of the corresponding alignment mark AM at each measurement coordinate point. In other words, the position of the camera 145 is adjusted so that the vertical axis from the surface of the alignment mark AM coincides with the optical axis of the camera 145. Note that in the processing in step S202, the correction amount of the positional relationship between the lower stage 140 and the camera 145 may be recorded in the relation table created in step S201. After the completion of the processing in step S202, the control device 10 ends the series of processes shown in FIG. 13.

(Practical Example of Method of Measuring Alignment Mark AM)

FIG. 14 is a schematic view showing a practical example of a method of measuring the alignment mark AM in the alignment processing of the lower wafer LW included in the bonding processing by the bonding apparatus 1 according to the second embodiment. FIG. 14 shows an example of the correction image of the optical axis and the correction image of the positional relationship between the lower stage 140 and the camera 145. An overview of the first to third deformation amounts and the coordinate points (1) to (3) is the same as in the first embodiment. Each two-dot dashed line indicated in the correction image of the optical axis indicates the tilt of the optical axis at each measurement coordinate point.

If the deformation amount of the lower stage 140 is the first deformation amount (no correction), the lower wafer LW vacuum-sucked by the lower stage 140 is held in the flat state. In this case, the tilts of the optical axis of the camera 145 at the time of measuring the alignment marks AM at the coordinate points (1), (2), and (3) are set to be almost equal to each other (for example, vertical). At this time, the positional relationship between the lower stage 140 and the camera 145 is controlled to a state in which each coordinate point indicated by the bonding recipe 110 matches the actual measurement coordinate point.

If the deformation amount of the lower stage 140 is the second deformation amount, the lower wafer LW vacuum-sucked by the lower stage 140 is held in a state in which the lower wafer LW is deformed in a convex shape. In this case, the tilt of the optical axis of the camera 145 at the time of measuring the alignment mark AM at each of the coordinate points (2) and (3) is set in a state in which the optical axis tilts outward with respect to the coordinate point (1) (that is, in a direction in which the reflected light RL moves away from the center portion of the lower wafer LW). At this time, for example, in measurement of the alignment mark AM_R at the coordinate point (3), the positional relationship between the lower stage 140 and the camera 145 is controlled to a state in which the coordinate point is shifted outward from that indicated by the bonding recipe 110 by a length L1.

If the deformation amount of the lower stage 140 is the third deformation amount, the lower wafer LW vacuum-sucked by the lower stage 140 is held in a state in which the lower wafer LW is deformed, in a convex shape, more than in the case of the second deformation amount. In this case, the tilt of the optical axis of the camera 145 at the time of measuring the alignment mark AM at each of the coordinate points (2) and (3) is set in a state in which the optical axis tilts outward with respect to the coordinate point (1) more than in the case of the second deformation amount. At this time, for example, in measurement of the alignment mark AM_R at the coordinate point (3), the positional relationship between the lower stage 140 and the camera 145 is controlled to a state in which the coordinate point is shifted outward from that indicated by the bonding recipe 110 by a length L2 longer than the length L1.

<2-3-2> Alignment Processing of Lower Wafer LW

FIG. 15 is a flowchart illustrating an example of the alignment processing of the lower wafer LW included in the bonding processing by the bonding apparatus 1 according to the second embodiment. The procedure of the alignment processing of the lower wafer LW in the bonding apparatus 1 according to the second embodiment will be described below with reference to FIG. 15.

If the alignment processing of the lower wafer LW according to the second embodiment starts, the control device 10 calculates the optical axis correction amount at each measurement coordinate point based on the relational expression of the optical axis correction amount corresponding to the deformation amount of the lower stage 140 (step S211). In other words, in the processing in step S211, the control device 10 selects (uses) the relational expression of the optical axis correction amount associated with the wafer magnification correction value applied to the lower wafer LW, and calculates the optical axis correction amount at each measurement coordinate point. In the processing in step S211, the control device 10 corrects the tilt of the optical axis based on the deformation model 111 of the lower wafer LW in a region where the camera 145 executes calibration of the focus.

Next, the control device 10 calculates the correction amount of the positional relationship between the lower stage 140 and the camera 145 at each measurement coordinate point based on the calculated optical axis correction amount at each measurement coordinate point (step S212).

Next, the control device 10 decides the optical axis and position of the camera 145 based on the optical axis correction amount calculated at the coordinate point (1) in the processing in step S211 and the correction amount of the positional relationship between the lower stage 140 and the camera 145, and searches for the best focus at the coordinate point (1) (step S213). In the processing in step S213, the best focus at the coordinate point (1) is decided.

Next, the control device 10 measures the alignment mark AM_C with the setting of the best focus decided in step S213 (step S214).

Next, the control device 10 decides the optical axis and position of the camera 145 based on the optical axis correction amount calculated at the coordinate point (2) in the processing in step S211 and the correction amount of the positional relationship between the lower stage 140 and the camera 145, and searches for the best focus at the coordinate point (2) (step S215). In the processing in step S215, the best focus at the coordinate point (2) is decided.

Next, the control device 10 measures the alignment mark AM_L with the setting of the best focus decided in step S215 (step S216).

Next, the control device 10 decides the optical axis and position of the camera 145 based on the optical axis correction amount calculated at the coordinate point (3) in the processing in step S211 and the correction amount of the positional relationship between the lower stage 140 and the camera 145, and searches for the best focus at the coordinate point (3) (step S217). In the processing in step S217, the best focus at the coordinate point (3) is decided.

Next, the control device 10 measures the alignment mark AM_R with the setting of the best focus decided in step S217 (step S218).

Next, the control device 10 adjusts the position of the lower stage 140 based on the measurement results obtained in steps S214, S216, and S218 (step S219). After the completion of the processing in step S219, the control device 10 completes the alignment processing of the lower wafer LW, and advances to the next processing in the bonding processing.

Note that the bonding apparatus 1 according to the second embodiment may integrate the processes in steps S213 and S214, the processes in steps S215 and S216, and the processes in steps S217 and S218, respectively. The processes in steps S112, S114, and S116 of the first embodiment may be combined with the processes in steps S213, S215, and S217, respectively. The bonding apparatus 1 according to the second embodiment may correct at least the optical axis for each measurement coordinate point based on the deformation model 111 corresponding to the deformation amount of the lower stage 140.

(Practical Example of Focus Operation in Bonding Processing)

FIG. 16 is a schematic view showing the relationship between the optical axis and the signal waveform at the time of the alignment processing in the bonding apparatus 1 according to the second embodiment. FIG. 16 shows, for each deformation amount of the lower stage 140, the measurement image of the alignment mark AM on the lower wafer LW and the signal waveform of the one pattern AP. The setting of the optical axis of the camera 145 for each of the first to third deformation amounts is the same as that described with reference to FIG. 15.

As shown in FIG. 16, if the deformation amount of the lower stage 140 is the first deformation amount (no correction), the lower wafer LW vacuum-sucked by the lower stage 140 is held in the flat state. Therefore, the optical axis of the camera 145 at each measurement coordinate point is set to be perpendicular to the front surface of the lower wafer LW. In this case, the signal waveform of the one pattern AP at each coordinate point on the upper stage 143 is almost symmetrical.

Then, in the bonding apparatus 1 according to the second embodiment, even if the deformation amount of the lower stage 140 is the second or third deformation amount, the optical axis of the camera 145 at each measurement coordinate point is set to be perpendicular to the front surface of the lower wafer LW. Therefore, even if the deformation amount of the lower stage 140 is the second or third deformation amount, the signal waveform of the one pattern AP at each measurement coordinate point on the upper stage 143 is almost symmetrical.

<2-4> Effect of Second Embodiment

As described above, if the lower stage 140 is deformed to correct the wafer magnification, the optical axis of the camera 145 may be shifted at the time of the alignment processing. The measurement result in the alignment processing may change.

To cope with this, the bonding apparatus 1 according to the second embodiment has a mechanism for adjusting the optical axis of the camera 145 at the time of the alignment processing in accordance with the deformation amount of the lower stage 140. For example, by deforming the lower stage 140 and adjusting the optical axis of the camera 145, the bonding apparatus 1 according to the second embodiment can maintain symmetry of the signal waveform even if defocusing occurs at one of the measurement coordinate points.

As a result, the bonding apparatus 1 according to the second embodiment can improve the measurement accuracy of the alignment processing, and improve the overlay accuracy in the bonding processing. Therefore, the bonding apparatus 1 according to the second embodiment can improve the performance of the bonding apparatus.

<3> Third Embodiment

The third embodiment relates to a practical example of a semiconductor device to which the method of manufacturing the semiconductor device described in each of the first and second embodiments can be applied. As a practical example of the semiconductor device, a memory device 2 as a NAND flash memory will be described below.

<3-1> Configuration

<3-1-1> Configuration of Memory Device 2

FIG. 17 is a block diagram showing an example of the configuration of the memory device 2 according to the third embodiment. As shown in FIG. 17, the memory device 2 includes, for example, a memory interface (memory I/F) 20, a sequencer 21, a memory cell array 22, a driver module 23, a row decoder module 24, and a sense amplifier module 25.

The memory I/F 20 is a hardware interface connected to an external memory controller. The memory I/F 20 performs communication complying with an interface standard between the memory device 2 and the memory controller. The memory I/F 20 supports, for example, the NAND interface standard.

The sequencer 21 is a control circuit that controls the overall operation of the memory device 2. The sequencer 21 controls the driver module 23, the row decoder module 24, the sense amplifier module 25, and the like based on commands received via the memory I/F 20 to execute a read operation, a write operation, an erase operation, and the like.

The memory cell array 22 is a storage circuit that includes a set of a plurality of memory cells. The memory cell array 22 includes a plurality of blocks BLK0 to BLKn (n is an integer of 1 or more). The block BLK is used as, for example, a data erase unit. A plurality of bit lines and a plurality of word lines are also provided in the memory cell array 22. Each memory cell is associated with, for example, one bit line and one word line. Each memory cell is identified based on an address for identifying a word line WL and an address for identifying a bit line BL.

The driver module 23 is a driver circuit that generates a voltage which is used in a read operation, a write operation, an erase operation, and the like. The driver module 23 is connected to the row decoder module 24 via a plurality of signal lines. The driver module 23 can change a voltage applied to each of the plurality of signal lines based on a page address received via the memory I/F 20.

The row decoder module 24 is a decoder that decodes a row address received via the memory I/F 20. The row decoder module 24 selects one block BLK based on the decoding result. Then, the row decoder module 24 transfers, to the plurality of wirings (word lines WL and the like) provided in the selected block BLK, the voltages respectively applied to the plurality of signal lines.

The sense amplifier module 25 is a sense circuit that senses, in a read operation, data which is read out from the selected block BLK based on the voltage of the bit line BL. The sense amplifier module 25 transmits the readout data to the memory controller via the memory I/F 20. Furthermore, in a write operation, the sense amplifier module 25 can apply, to each bit line BL, a voltage corresponding to the data to be written in the memory cell.

<3-1-2> Circuit Configuration of Memory Cell Array 22

FIG. 18 is a circuit diagram showing an example of the circuit configuration of the memory cell array 22 included in the memory device 2 according to the third embodiment. FIG. 18 shows one block BLK among the plurality of blocks BLK included in the memory cell array 22. As shown in FIG. 18, the block BLK includes, for example, string units SU0 to SU3.

Each string unit SU includes a plurality of NAND strings NS. The NAND strings NS are associated with bit lines BL0 to BLm (m is an integer of 1 or more), respectively. Different column addresses are allocated to the bit lines BL0 to BLm, respectively. Each bit line BL is shared by the NAND strings NS to which the same column address is assigned among the plurality of blocks BLK. Each NAND string NS includes, for example, memory cell transistors MT0 to MT7 and selection transistors STD and STS.

Each memory cell transistor MT includes a control gate and a charge storage layer, and nonvolatilely stores data. The memory cell transistors MT0 to MT7 of each NAND string NS are connected in series. The control gates of the memory cell transistors MT0 to MT7 are connected to the word lines WL0 to WL7, respectively. Each of the word lines WL0 to WL7 is provided for each block BLK. A set of the plurality of memory cell transistors MT connected to the common word line WL in the same string unit SU will be referred to as, for example, a "cell unit CU" hereinafter. If each memory cell transistor MT stores 1-bit data, the cell unit CU stores "1-page data". The cell unit CU can have a storage capacity of 2-page data or more in accordance with the number of bits of data stored by the memory cell transistor MT.

Each of the selection transistors STD and STS is used to select the string unit SU. The drain of the selection transistor STD is connected to the associated bit line BL. The source of the selection transistor STD is connected to one end of the memory cell transistors MT0 to MT7 connected in series. The gates of the selection transistors STD included in the string units SU0 to SU3 are connected to selection gate lines SGD0 to SGD3, respectively. The drain of the selection transistor STS is connected to the other end of the memory cell transistors MT0 to MT7 connected in series. The source of the selection transistor STS is connected to a source line SL. The gate of the selection transistor STS is connected to a selection gate line SGS. The source line SL is shared by, for example, the plurality of blocks BLK.

<3-1-3> Structure of Memory Device 2

An example of the structure of the memory device 2 according to the third embodiment will be described below. Note that, in the third embodiment, the X direction corresponds to the direction of extension of the word lines WL, the Y direction corresponds to the direction of extension of the bit lines BL, and the Z direction corresponds to the direction perpendicular to the front surface of the semiconductor substrate (wafer) used to form the memory device 2.

FIG. 19 is a perspective view showing an example of the structure of the memory device 2 according to the third embodiment. As shown in FIG. 19, the memory device 2 includes a memory chip MC and a CMOS chip CC. The lower surface of the memory chip MC corresponds to the front surface of the lower wafer LW. The upper surface of the CMOS chip CC corresponds to the front surface of the upper wafer UW. The memory chip MC includes, for example, a memory region MR, hookup regions HR1 and HR2, and a pad region PR1. The CMOS chip CC includes, for example, a sense amplifier region SR, a peripheral circuit region PERI, transfer regions XR1 and XR2, and a pad region PR2.

The memory region MR includes the memory cell array 22. The hookup regions HR1 and HR2 include a wiring or the like that is used to connect the stacked wiring provided in the memory chip MC and the row decoder module 24 provided in the CMOS chip CC. The pad region PR1 includes a pad or the like that is used to connect the memory device 2 and the memory controller. The hookup regions HR1 and HR2 sandwich the memory region MR in the X direction. The pad region PR1 is adjacent to the memory region MR and the hookup regions HR1 and HR2 in the Y direction.

The sense amplifier region SR includes the sense amplifier module 25. The peripheral circuit region PERI includes the sequencer 21 and the driver module 23. The transfer regions XR1 and XR2 include the row decoder module 24. The pad region PR2 includes the memory I/F 20. The sense amplifier region SR and the peripheral circuit region PERI are arranged adjacent to each other in the Y direction and overlap the memory region MR. The transfer regions XR1 and XR2 sandwich a set of the sense amplifier region SR and the peripheral circuit region PERI in the X direction, and overlap the hookup regions HR1 and HR2, respectively. The pad region PR2 overlaps the pad region PR1 of the memory chip MC.

The memory chip MC includes a plurality of bonding pads BP below the memory region MR, the hookup regions HR1 and HR2, and the pad region PR1, respectively. The bonding pads BP of the memory region MR are connected to the associated bit lines BL. The bonding pads BP of the hookup region HR are connected to associated wirings (for example, word lines WL) of the stacked wiring provided in the memory region MR. The bonding pads BP of the pad region PR1 are connected to pads (not shown) provided on the upper surface of the memory chip MC. The pads provided on the upper surface of the memory chip MC are used to, for example, connect the memory device 2 and the memory controller.

The CMOS chip CC includes a plurality of bonding pads BP above the sense amplifier region SR, the peripheral circuit region PERI, the transfer regions XR1 and XR2, and the pad region PR2, respectively. The bonding pads BP of the sense amplifier region SR overlap the bonding pads BP of the memory region MR, respectively. The bonding pads BP of the transfer regions XR1 and XR2 overlap the bonding pads BP of the hookup regions HR1 and HR2, respectively. The bonding pads BP of the pad region PR1 overlap the bonding pads BP of the pad region PR2, respectively.

The memory device 2 has a structure in which the lower surface of the memory chip MC and the upper surface of the CMOS chip CC are bonded to each other. Among the plurality of bonding pads BP provided in the memory device 2, two bonding pads BP facing each other between the memory chip MC and the CMOS chip CC are electrically connected by bonding. Thus, the circuit in the memory chip MC and the circuit in the CMOS chip CC are electrically connected to each other via the bonding pads BP. A set of two bonding pads BP facing each other between the memory chip MC and the CMOS chip CC may have a boundary or may be integrated with each other.

(Planar Layout of Memory Cell Array 22)

FIG. 20 is a plan view showing an example of a planar layout of the memory cell array 22 included in the memory device 2 according to the third embodiment. FIG. 20 shows a region that includes one block BLK in the memory region MR. As shown in FIG. 20, the memory device 2 includes, for example, a plurality of slits SLT, a plurality of slits SHE, a plurality of memory pillars MP, a plurality of bit lines BL, and a plurality of contacts CV. In the memory region MR, a planar layout to be described below is repeatedly arranged in the Y direction.

Each slit SLT has, for example, a structure in which an insulating member is embedded. Each slit SLT insulates adjacent wirings (for example, the word lines WL0 to WL7 and the selection gate lines SGD and SGS) via the slit SLT. Each slit SLT has a portion that is provided so as to extend in the X direction, and crosses the memory region MR and the hookup regions HR1 and HR2 in the X direction. The plurality of slits SLT are arranged in the Y direction. The regions that are partitioned by the slits SLT correspond to the blocks BLK.

Each slit SHE has, for example, a structure in which an insulating member is embedded. Each slit SHE insulates adjacent wirings (at least the selection gate lines SGD) via the slit SLT. Each slit SHE has a portion that is provided so as to extend in the X direction, and crosses the memory region MR. The plurality of slits SHE are arranged in the Y direction. In this example, three slits SHE are arranged between the adjacent slits SLT. The plurality of regions partitioned by the slits SLT and SHE correspond to the string units SU0 to SU3, respectively.

Each memory pillar MP functions as, for example, one NAND string NS. The plurality of memory pillars MP are arranged in a staggered pattern of, for example, 19 rows in a region between two adjacent slits SLT. Furthermore, one slit SHE overlaps the memory pillars MP in the fifth column, the memory pillars MP in the 10th column, or the memory pillars MP in the 15th column, counted from the upper side of the drawing.

Each bit line BL has a portion that is provided so as to extend in the Y direction, and crosses, in the Y direction, a region where the plurality of blocks BLK are provided. The plurality of bit lines BL are arranged in the X direction. Each bit line BL is arranged so as to overlap at least one memory pillar MP for each string unit SU. In this example, two bit lines BL overlap each memory pillar MP.

Each contact CV is provided between one bit line BL, among the plurality of bit lines BL overlapping the memory pillar MP, and the memory pillar MP. The contact CV electrically connects the memory pillar MP and the bit line BL to each other. Note that the contact CV between the memory pillar MP overlapping the slit SHE and the bit line BL is omitted.

(Cross-Sectional Structure of Memory Cell Array 22)

FIG. 21 is a cross-sectional view showing an example of the cross-sectional structure of the memory cell array 22 included in the memory device 2 according to the third embodiment. FIG. 21 shows a cross-section that is taken along the Y direction and includes the memory pillars MP and the slits SLT in the memory region MR. Note that the Z direction in FIG. 21 indicates the lower side of the paper surface, but in the description of FIG. 21, the upper side of the paper surface is referred to as "up", and the lower side of the paper surface is referred to as "down". As shown in FIG. 21, the memory device 2 includes, for example, insulating layers 30 to 37, conductive layers 40 to 46, and contacts V1 and V2.

The insulating layer 30 is provided in, for example, the lowermost layer of the memory chip MC. The conductive layer 40 is provided on the insulating layer 30. The insulating layer 31 is provided on the conductive layer 40. The conductive layers 41 and the insulating layers 32 are alternately provided on the insulating layer 31. The insulating layer 33 is provided on the uppermost conductive layer 41. The conductive layers 42 and the insulating layers 34 are alternately provided on the insulating layer 33. The insulating layer 35 is provided on the uppermost conductive layer 42. The conductive layers 43 and the insulating layers 36 are alternately provided on the insulating layer 35. The insulating layer 37 is provided on the uppermost conductive layer 43. The conductive layer 44 is provided on the insulating layer 37. The contact V1 is provided on the conductive layer 44. The conductive layer 45 is provided on the contact V1. The contact V2 is provided on the conductive layer 45. The conductive layer 46 is provided on the contact V2. The wiring layers provided with the conductive layers 44, 45, and 46 will be referred to as "M0", "M1", and "M2", respectively, hereinafter.

Each of the conductive layers 40, 41, 42, and 43 is formed in, for example, a plate shape that spreads along the X-Y plane. The conductive layer 44 is formed in, for example, a line shape that extends in the Y direction. The conductive layers 40, 41, and 43 are used as the source line SL, the selection gate line SGS, and the selection gate line SGD, respectively. The plurality of conductive layers 42 are used as the word lines WL0 to WL7, respectively, in order from the side of the conductive layer 40. The conductive layer 44 is used as the bit line BL. The contacts V1 and V2 are provided in a columnar shape. The conductive layers 44 and 45 are connected to each other via the contact V1. The conductive layers 45 and 46 are connected to each other via the contact V2. The conductive layer 45 is, for example, a wiring formed in a line shape that extends in the X direction. The conductive layer 46 is in contact with the interface of the memory chip MC and is used as the bonding pad BP. The conductive layer 46 contains, for example, copper.

The slit SLT has a portion formed in a plate shape that spreads along the X-Z plane, and divides the insulating layers 31 to 36 and the conductive layers 41 to 43. Each memory pillar MP is provided so as to extend along the Z direction, and penetrates the insulating layers 31 to 36 and the conductive layers 41 to 43. Each memory pillar MP includes, for example, a core member 50, a semiconductor layer 51, and a stacked film 52. The core member 50 is an insulator provided so as to extend along the Z direction. The semiconductor layer 51 covers the core member 50. A lower portion of the semiconductor layer 51 is in contact with the conductive layer 40. The stacked film 52 covers the side surface of the semiconductor layer 51. The contact CV is provided on the semiconductor layer 51. The conductive layer 44 is in contact with the top of contact CV.

Note that, in the region shown in FIG. 21, the contact CV corresponding to one memory pillar MP of the two memory pillars MP is shown. The memory pillar MP to which the contact CV is not connected in the region is connected to the contact CV in a region (not shown). A portion where the memory pillar MP intersects the plurality of conductive layers 41 functions as the selection transistor STS. A portion where the memory pillar MP intersects the conductive layer 42 functions as the memory cell transistor MT. A portion where the memory pillar MP intersects the plurality of conductive layers 43 functions as the selection transistor STD.

(Cross-Sectional Structure of Memory Pillar MP)

FIG. 22 is a cross-sectional view taken along a line XXII-XXII in FIG. 22 and showing an example of the cross-sectional structure of the memory pillar MP included in the memory device 2 according to the third embodiment. FIG. 22 shows a cross-section that includes the memory pillar MP and the conductive layer 42 and is parallel to the conductive layer 40. As shown in FIG. 22, the stacked film 52 includes, for example, a tunnel insulating film 53, an insulating film 54, and a block insulating film 55.

The core member 50 is provided in, for example, the center portion of the memory pillar MP. The semiconductor layer 51 surrounds the side surface of the core member 50. The tunnel insulating film 53 surrounds the side surface of the semiconductor layer 51. The insulating film 54 surrounds the side surface of the tunnel insulating film 53. The block insulating film 55 surrounds the side surface of the insulating film 54. The conductive layer 42 surrounds the side surface of the block insulating film 55. The semiconductor layer 51 is used as a channel (current path) of the memory cell transistors MT0 to MT7 and the selection transistors STD and STS. Each of the tunnel insulating film 53 and the block insulating film 55 contains, for example, silicon oxide. The insulating film 54 is used as the charge storage layer of the memory cell transistor MT, and contains, for example, silicon nitride. As a result, each of the memory pillars MP functions as one NAND string NS.

(Cross-Sectional Structure of Memory Device 4)

FIG. 23 is a cross-sectional view showing an example of the cross-sectional structure of the memory device 2 according to the third embodiment. FIG. 23 shows a cross-section including the memory region MR and the sense amplifier region SR, that is, a cross-section including the memory chip MC and the CMOS chip CC. As shown in FIG. 23, the memory device 4 includes a semiconductor substrate 60, conductive layers GC and 61 to 64, and contacts CS and C0 to C3 in the sense amplifier region SR.

The semiconductor substrate 60 is a substrate that is used to form the CMOS chip CC. The semiconductor substrate 60 includes a plurality of well regions (not shown). For example, a transistor TR is formed in each of the plurality of well regions. The plurality of well regions are separated by, for example, SIT (Shallow Trench Isolation). A conductive layer GC is provided on the semiconductor substrate 60 via a gate insulating film. The conductive layer GC in the sense amplifier region SR is used as the gate electrode of the transistor TR included in the sense amplifier module 25. The contact C0 is provided on the conductive layer GC. Two contacts CS are provided on the semiconductor substrate 60 in correspondence with the source and the drain of the transistor TR.

The conductive layer 61 is provided on each of the contacts CS and C0. The contact C1 is provided on conductive layer 61. The conductive layer 62 is provided on the contact C1. The conductive layers 61 and 62 are electrically connected to each other via the contact C1. The contact C2 is provided on the conductive layer 62. The conductive layer 63 is provided on the contact C2. The conductive layers 62 and 63 are electrically connected to each other via the contact C2. The contact C3 is provided on the conductive layer 63. The conductive layer 64 is provided on the contact C3. The conductive layers 63 and 64 are electrically connected to each other via the contact C3. The wiring layers on which the conductive layers 61 to 64 are provided will be referred to as "D0", "D1", "D2", and "D3", respectively, hereinafter.

The conductive layer 64 is in contact with the interface of the CMOS chip CC and is used as the bonding pad BP. The conductive layer 64 in the sense amplifier region SR is bonded to the conductive layer 46 (that is, the bonding pad BP of the memory chip MC) in the memory region MR that is arranged to face the conductive layer 64. Then, each conductive layer 64 in the sense amplifier region SR is electrically connected to one bit line BL. The conductive layer 64 contains, for example, copper.

In the memory device 2, the wiring layer D3 of the CMOS chip CC and the wiring layer M2 of the memory chip MC are adjacent to each other due to bonding of the memory chip MC and the CMOS chip CC. The semiconductor substrate 60 corresponds to the back surface side of the upper wafer UW, and the wiring layer D3 corresponds to the front surface side of the upper wafer UW. The insulating layer 30 corresponds to the back surface side of the lower wafer LW, and the wiring layer M2 corresponds to the front surface side of the lower wafer LW. The semiconductor substrate, which is used to form the memory chip MC, is removed along with a pad formation process and the like after the bonding processing.

<3-2> Effect of Third Embodiment

As described hereinabove, the memory device 2 includes, for example, the memory chip MC including a structure in which memory cells are three-dimensionally stacked, and the CMOS chip CC including other control circuits. With respect to the memory chip MC and the CMOS chip CC, the variation in wafer magnification tends to be larger between the wafers in the memory chip MC. More specifically, since the memory chip MC includes the memory cell array 22 formed in a high layer, the variation in the amount of warpage of the wafer increases, and the variation in wafer magnification may increase. On the other hand, the configuration of the shots of the CMOS chip CC is close to an ideal lattice that is based on the exposure apparatus. Therefore, when the bonding processing is executed, the wafer on which the memory chip MC is formed is preferably assigned to the lower wafer LW for which the wafer magnification can be corrected, and the wafer on which the CMOS chip CC is formed is preferably assigned to the upper wafer UW. Thus, each of the first and second embodiments can improve the yield of the memory device 2.

<4> Others

In the above embodiments, the flowcharts used to describe the operations are merely examples. With respect to the operations described using the flowcharts, the order of the processes may be changed within a possible range, other processes may be added, or some processes may be omitted. The above embodiment has exemplified a case in which the deformation models 111 are collectively created in step S109. However, every time the processing in step S105 is completed, calculation of the deformation model 111 based on the measurement results obtained in step S105 may be executed. Similarly, in the second embodiment, every time the processing in step S105 is completed, calculation of the deformation model 111 based on the measurement results obtained in step S105 and creation of the relational expression of the optical axis correction amount may be executed. The above embodiment has exemplified a case in which bonding is performed by applying alignment correction to the lower wafer LW placed (held) on the lower stage 140 but the present invention is not limited to this. The alignment correction in the bonding processing may be applied to, for example, the upper wafer UW placed (held) on the upper stage 143, or may be applied to both the upper wafer UW held on the upper stage 143 and the lower wafer LW held on the lower stage 140. In this specification, an MPU (Micro Processing Unit), an ASIC (Application Specific Integrated Circuit), an FPGA (Field-Programmable Gate Array), or the like may be used instead of the CPU. Furthermore, each of the processes described in the embodiment may also be implemented using dedicated hardware. The processing described in the embodiment may be a mixture of processing executed by software and processing executed by hardware, or only either one of such processing may be used.

In each embodiment, each of the cameras 142 and 145 of the bonding apparatus 1 may have an configuration in which an optical system (microscope) and a light receiving sensor are separated, and may be able to measure the alignment mark AM. Each of the cameras 142 and 145 may be referred to as a "measurement device", "measuring device", or "alignment camera". "Optical axis" may be paraphrased as "optical path". In the present specification, "overlap deviation" may be paraphrased as "misalignment". In the description of the first and second embodiments, "height" is associated with the focus position. The method of calibrating the focus is not limited to that described in each embodiment, and another method may be used. Each embodiment has exemplified a case in which the deformation model 111 is created with reference to the best focus position but the deformation model 111 may indicate at least the shape of the front surface of the lower wafer LW.

The configuration described in the third embodiment is merely an example, and the configuration of the memory device 2 is not limited to this. The circuit configuration, planar layout, and cross-sectional structure of the memory device 2 can be appropriately changed in accordance with the design of the memory device 2. For example, although the third embodiment has exemplified a case in which the memory chip MC is provided on the CMOS chip CC, the CMOS chip CC may be provided on the memory chip MC. Although a case in which the memory chip MC is assigned to the lower wafer LW and the CMOS chip CC is assigned to the upper wafer UW has been exemplified, the memory chip MC may be assigned to the upper wafer UW, and the CMOS chip CC may be assigned to the lower wafer LW. When the manufacturing method described in each of the first and second embodiments is applied, a wafer exhibiting a large variation in wafer magnification between wafers is preferably assigned to the lower wafer LW. Thus, overlay deviation in the bonding processing can be suppressed, thereby suppressing the occurrence of a defect caused by such overlay deviation.

In the present specification, "connection" indicates electrical connection, and does not exclude connection via another element. "Electrically connected" may indicate that an insulator is interposed, as long as the same operation as that performed by electrically connected elements can be executed. "Columnar shape" indicates a structure that is provided in a hole formed in the manufacturing process. The "plan view" corresponds to, for example, viewing an object in a direction perpendicular to the front surface of the semiconductor substrate 60. A "region" may be regarded as a component that is included in the semiconductor substrate 60 of the CMOS chip CC. For example, if it is prescribed that the semiconductor substrate 60 includes the memory region MR, the memory region MR is associated with a region above the semiconductor substrate 60. The bonding pad BP may also be referred to as "joint metal".

Note that some or all of the above-described embodiments can be described as in the following supplementary notes, but is not limited to the followings.

<Supplementary Note 1>

There is provided a bonding apparatus comprising:

a first stage configured to hold a first substrate;

a second stage configured to hold a second substrate and arranged above the first stage;

a first measuring device configured to measure an alignment mark arranged on the first substrate held by the first stage;

a second measuring device configured to measure an alignment mark arranged on the second substrate held by the second stage;

a stress generator configured to apply stress to the first stage; and a controller configured to execute bonding processing of bonding the first substrate and the second substrate, wherein the bonding processing includes alignment processing of each of the first substrate and the second substrate, and the controller is configured to generate a focus map for each deformation amount of the first stage based on the deformation amount of the first stage deformed by the stress generator and a shape of the first substrate held by the deformed first stage, and correct, in a case where the first measuring device is caused to measure the alignment mark arranged on the first substrate held by the first stage in the alignment processing of the first substrate, an optical axis of the first measuring device based on an optical axis correction amount corresponding to the deformation amount applied to the first stage.

<Supplementary Note 2>

There is provided the bonding apparatus of supplementary note 1, wherein in a case where the first measuring device is caused to measure the alignment mark arranged on the first substrate held by the first stage in the alignment processing of the first substrate, the controller corrects a positional relationship between the first stage and the first measuring device based on the optical axis correction amount.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A bonding apparatus comprising:

a first stage configured to hold a first substrate;

a second stage configured to hold a second substrate, the second stage being arranged to face the first stage;

a first camera configured to measure an alignment mark arranged on the first substrate held by the first stage;

a second camera configured to measure an alignment mark arranged on the second substrate held by the second stage;

a stress generator configured to deform the first stage; and a controller configured to execute bonding processing of bonding the first substrate and the second substrate, wherein:

the bonding processing includes alignment processing of each of the first substrate and the second substrate, the controller is configured to:

generate a focus map for imaging, based on a deformation amount of the first stage deformed by the stress generator and a shape of the first substrate held by the deformed first stage, and control the first camera such that, in the alignment processing of the first substrate, the first camera measures the alignment mark arranged on the first substrate held by the first stage using a focus setting based on the focus map, and the focus map includes a first best focus associated with a first deformation amount of the first stage, and a second best focus associated with a second deformation amount of the first stage different from the first deformation amount.

2. The apparatus of claim 1, wherein:

the alignment processing of the first substrate includes measurement of a first alignment mark, a second alignment mark, and a third alignment mark arranged on the first substrate, the first alignment mark is arranged in a center portion of the first substrate, the second alignment mark and the third alignment mark are arranged on one side and the other side of an outer periphery of the first substrate, respectively, and the controller is configured to, in using the focus setting based on the focus map, measure the first alignment mark using a first position of a focus range, and measure each of the second alignment mark and the third alignment mark using a second position of the focus range lower than the first position of the focus range.

3. The apparatus of claim 2, wherein the controller is configured to generate the focus map by measuring the first to third alignment marks using a width of a focus range wider than the focus setting based on the focus map.

4. The apparatus of claim 1, wherein the controller is configured to generate the focus map based on a measurement result of the first best focus and the second best focus with respect to the first substrate held by the deformed first stage.

5. The apparatus of claim 1, wherein the controller is configured to (i) control the first camera such that, in the alignment processing of the first substrate, the first camera measures the alignment mark arranged on the first substrate held by the first stage, and (ii) correct an optical axis of the first camera based on an optical axis correction amount corresponding to the deformation amount applied to the first stage.

6. The apparatus of claim 5, wherein the controller is configured to (i) control the first camera such that, in the alignment processing of the first substrate, the first camera measures the alignment mark arranged on the first substrate, and (ii) correct a positional relationship between the first stage and the first camera based on the optical axis correction amount.

7. The apparatus of claim 1, wherein:

the first stage is a stage disposed on a lower side, and the second stage is a stage disposed on an upper side.

8. The apparatus of claim 1, further comprising:

a pushpin provided in the second stage, wherein the controller is configured to lower the pushpin to deform the second substrate and bring the second substrate into contact with the first substrate.

9. The apparatus of claim 1, wherein the first substrate is deformed by deformation of the first stage.

10. A bonding method of bonding a first substrate held by a first stage and a second substrate held by a second stage, including alignment processing of each of the first substrate and the second substrate, the method comprising:

generating a focus map for imaging, based on a deformation amount of the first stage deformed by a stress generator and a shape of the first substrate held by the deformed first stage; and measuring, in the alignment processing of the first substrate, an alignment mark arranged on the first substrate held by the first stage using a focus setting based on the focus map, wherein the focus map includes a first best focus associated with a first deformation amount of the first stage, and a second best focus associated with a second deformation amount of the first stage different from the first deformation amount.

11. The bonding method of claim 10, wherein:

the first stage is a stage disposed on a lower side, and the second stage is a stage disposed on an upper side.

12. The bonding method of claim 10, further comprising:

lowering a pushpin to deform the second substrate and bring the second substrate into contact with the first substrate.

13. The bonding method of claim 10, wherein the first substrate is deformed by deformation of the first stage.

14. A method of manufacturing a semiconductor device configured by bonding a first substrate held by a first stage and a second substrate held by a second stage, including alignment processing of each of the first substrate and the second substrate, the method comprising:

generating a focus map for imaging, based on a deformation amount of the first stage deformed by a stress generator and a shape of the first substrate held by the deformed first stage; and measuring, in the alignment processing of the first substrate, an alignment mark arranged on the first substrate held by the first stage using a focus setting based on the focus map, wherein the focus map includes a first best focus associated with a first deformation amount of the first stage, and a second best focus associated with a second deformation amount of the first stage different from the first deformation amount.

15. The method of claim 14, wherein:

the first stage is a stage disposed on a lower side, and the second stage is a stage disposed on an upper side.

16. The method of claim 14, further comprising:

lowering a pushpin to deform the second substrate and bring the second substrate into contact with the first substrate.

17. The method of claim 14, wherein the first substrate is deformed by deformation of the first stage.

* * * * *